United States Patent [19]

Iwamuro et al.

[11] Patent Number: 6,091,087
[45] Date of Patent: Jul. 18, 2000

[54] INSULATED GATE THYRISTOR

[75] Inventors: Noriyuki Iwamuro; Yuichi Harada; Tadayoshi Iwaana, all of Nagano, Japan

[73] Assignee: Fuji Electric Co., Ltd, Japan

[21] Appl. No.: 08/852,269

[22] Filed: May 6, 1997

[30] Foreign Application Priority Data

May 9, 1996 [JP] Japan ................................. 8-114035

[51] Int. Cl.[7] .......................... H01L 29/74; H01L 29/00
[52] U.S. Cl. ...................... 257/133; 257/138; 257/137; 257/134; 257/147
[58] Field of Search ............................... 257/335, 330, 257/133, 138, 137, 134, 147

[56] References Cited

U.S. PATENT DOCUMENTS

| 4,698,655 | 10/1987 | Schultz | 357/23.4 |
|---|---|---|---|
| 4,847,671 | 7/1989 | Pattanayak et al. | 357/38 |
| 5,151,762 | 9/1992 | Uenishi et al. | 357/43 |
| 5,614,738 | 3/1997 | Iwamuro | 257/147 |
| 5,766,966 | 6/1998 | Ng | 437/40 |

FOREIGN PATENT DOCUMENTS

736909 A2  9/1996  European Pat. Off. ............... 257/137

*Primary Examiner*—Leo P. Picard
*Assistant Examiner*—Hung Van Duong
*Attorney, Agent, or Firm*—Rossi & Associates

[57] ABSTRACT

An insulated gate thyristor includes a first-conductivity-type base layer having a high resistivity, first and second second-conductivity-type base regions formed in a surface layer of the first-conductivity-type base layer, a first-conductivity-type source region formed in a surface layer of the first second-conductivity-type base region, and a first-conductivity-type emitter region formed in a surface layer of the second second-conductivity-type base region. The thyristor further includes a gate electrode formed through an insulating film on the first second-conductivity-type base region, an exposed portion of the first-conductivity-type base layer and the second second-conductivity-type base region, a first main electrode that contacts both the first second-conductivity-type base layer and first-conductivity-type source region, a second-conductivity-type emitter layer formed on the first-conductivity-type base layer, a second main electrode that contacts the second-conductivity-type emitter layer, and an insulating film covering entire areas of surfaces of the second second-conductivity-type base region and first-conductivity-type emitter region. The second second-conductivity-type base region has a diffusion depth that is greater than a larger one of diffusion depths of the first second-conductivity-type base region and a second-conductivity-type well region included in the first second-conductivity-type base region.

46 Claims, 15 Drawing Sheets

INSULATED GATE THYRISTOR

FIELD OF THE INVENTION

The present invention relates in general to an insulated gate thyristor. More specifically, the invention relates to an insulated gate thyristor used as a power switching device.

BACKGROUND OF THE INVENTION

Thyristors have been used as indispensable devices for large capacity power switching owing to the low ON-state voltage characteristic. For example, GTO (gate turn-off) thyristors are widely used in these days in high-voltage large-current range applications. The GTO thyristor, however, has revealed drawbacks as follows: first, the GTO thyristor requires large gate current for turn-off, in other words, the thyristor has a relatively small turn-off gain; and secondly, a large-sized snubber is needed to safely turn off the GTO thyristor. In addition, since the GTO thyristor does not show current saturation in its current-voltage characteristic, a passive component, such as a fuse, must be coupled to the thyristor so as to protect a load from short-circuiting. This greatly impedes the reduction in the size and cost of the whole system.

A MOS controlled thyristor (hereinafter abbreviated as MCT) as a voltage-driven type thyristor was proposed by V. A. K. Temple in IEEE IEDM Tech, Dig., 1984, p282. Since then, the characteristics of this type of thyristor have been analyzed and improved in various institutions worldwide. This is because the MCT, which is a voltage-driven type device, requires a far simpler gate circuit than the GTO thyristor, while assuring a relatively low ON-state voltage characteristic. The MCT, however, does not show a current saturation characteristic, as in the case of the GTO thyristor, and therefore requires a passive component, such as a fuse, in its practical use.

Dr. Pattanayak and others revealed that an emitter switched thyristor (hereinafter abbreviated as EST) shows a current saturation characteristic, as disclosed in U.S. Pat. No. 4,847,671 (Jul. 11, 1989). Subsequently, M. S. Shekar and others proved by actual measurements that a dual channel type emitter switched thyristor (EST-1) shows a current saturation characteristic even in a high voltage range, as disclosed in IEEE Electron Device Letters vol. 12 (1991), p387. In Proceedings of IEEE ISPSD '93, p71 and Proceedings of IEEE ISPSD '94, p195, the inventors of the present invention disclosed results of their analysis on a forward bias safe operation area (FBSOA) and a reverse bias safe operation area (RBSOA) of this EST, and paved the way to the development of a voltage-driven type thyristor having the safe operation area in which the device operates safely when a load is short-circuited. FIG. 17 shows the structure of this EST device.

In the device as shown in FIG. 17, a first p base region 4, p+ well region 5 and a second p base region 6 are formed in a surface layer of an n base layer 3 deposited on a p emitter layer 1 through an n+ buffer layer 2. The p+ well region 5 forms a part of the first p base layer 4, and has a relatively large diffusion depth. An n source region 7 is formed in a surface layer of the first p base region 4, and an n emitter layer 8 is formed in a surface layer of the second p base region 6. A gate electrode 10 is formed through a gate oxide film 9 over a portion of the first p base region 4 that is interposed between the n source region 7 and an exposed portion of the n base layer 3, and a portion of the second p base region 6 that is interposed between the n emitter region 8 and an exposed portion of the n base layer 3. The length of each of the n source region 7, n emitter region 8 and gate electrode 10 is limited in the Z-direction in FIG. 17, and the first p base region 4 and the second p base region 6 are coupled to each other outside these regions 7, 8 and electrode 10. Further, the L-shaped p+ well region 5 is formed outside the coupled portion of the first and second p base regions 4, 6. A cathode electrode 11 is formed in contact with both a surface of the p+ well region 5, and a surface of the n source region 7. On the other hand, an anode electrode 12 is formed over the entire area of the rear surface of the p emitter layer 1.

When the cathode electrode 11 of this device is grounded, and positive voltage is applied to the gate electrode 10 while positive voltage is applied to the anode electrode 12, an inversion layer (partial accumulation layer) is formed under the gate oxide film 9, and a lateral MOSFET is thus turned on. As a result, electrons are supplied from the cathode electrode 11 to the n base layer 3, through the n source region 7, and the inversion layer (channel) formed in the surface layer of the first p base region 4. These electrons function as base current for a pnp transistor, which consists of the p emitter layer 1, n+ buffer layer 2 and n base layer 3, and the first and second p base regions 4, 6 and p+ well region 5. This pnp transistor operates with this base current. Then, holes are injected from the p emitter layer 1, and flow into the first p base region 4 through the n+ buffer layer 2 and n base layer 3. A part of the holes flow into the second p base region 6, and then flow under the n emitter region 8 in the Z direction to the cathode electrode 11. Thus, the device operates in an IGBT (insulated gate bipolar transistor) mode. With a further increase in the current, the pn junction between the n emitter region 8 and the second p base region 6 is forward biased, and a thyristor portion consisting of the p emitter layer 1, n+ buffer layer 2, n base layer 3, second p base region 6 and n emitter region 8 latches up. In this case, the device operates in a thyristor mode. To turn off the EST, the MOSFET is turned off by lowering the potential of the gate electrode 10 below the threshold of the lateral MOSFET. As a result, the n emitter region 8 is potentially separated from the cathode electrode 11, and the device stops operating in the thyristor mode.

FIGS. 18 and 19 are cross sectional views of improved ESTs as disclosed in U.S. Pat. No. 5,317,171 issued May 31, 1994 and U.S. Pat. No. 5,319,222 issued Jun. 7, 1994 to M. S. Shekar et al. The improved EST of FIG. 19, in particular, is different from the EST shown in FIG. 17, and is designed so as to provide an improved low ON-state voltage characteristic.

FIG. 20 is a cross sectional view of a FET controlled thyristor as disclosed in U.S. Pat. No. 4,502,070 issued Feb. 26, 1985 to L. Leipold et al. This thyristor is characterized in that the electrode does not contact on the second p base region 6.

As is understood from the above description, the EST as shown in FIG. 17 utilizes the holes flowing in the second p base region 6 in the Z direction so as to forward bias the pn junction between the second p base region 6 and the n emitter region 8, and therefore a degree or strength of the forward bias decreases in the Z direction toward a contact area of the second p base region 6 with the cathode electrode 11. Namely, the amount of electrons injected from the n emitter region 8 is not uniform over the length of the pn junction in the Z direction. If this EST is switched from this ON state to the OFF state, a weakly biased portion of the pn junction near the contact area with the cathode electrode 11 initially resumes its reverse-blocking ability, and a deeply biased portion of the pn junction remote from the contact area with the cathode electrode 11 slowly resumes the same ability. This tends to cause current localization or concentration upon turn-off, resulting in reduced breakdown withstand capability of the EST during turn-off.

Although the EST shown in FIG. 18 operates in a similar manner to the EST of FIG. 17, the EST of FIG. 18 can be turned off more rapidly since the cathode electrode 11 extends in the Y direction, to be in direct contact with the surface of the second p base region 6. Further, the EST of FIG. 18 shows a uniform turn-off characteristic due to the absence of the hole current flowing in the Z direction. In the operation of this thyristor, however, minority carriers are not uniformly injected in the horizontal direction (Y direction) when the pn junction between the n emitter region 8 and the second p base region 6 is turned on, and therefore the ON-state voltage cannot be lowered as expected. If the impurity concentration of the second p base region 6 is reduced to increase its resistance, for example, so as to solve this problem, a depletion layer is punched through the n emitter region 8 during withstanding of the voltage applied in the forward direction. Thus, the conventional EST cannot achieve a sufficiently high withstand voltage.

In the device shown in FIG. 19, the n emitter region 8 extends beyond the second p base region 6 so as to further lower the ON-state voltage. This structure, however, is unable to withstand the voltage applied in the forward direction.

In the device shown in FIG. 20, the n emitter region 8 and second base region 6 are completely separated from the cathode electrode 11, thus preventing the non-uniform operation of the thyristor. This structure, however, has drawbacks as follows: first, the device shows reduced breakdown withstand capability since the hole current flows through the device such that it concentrates on the side of the first p base region 4; and secondly, the conductance in the operation of the transistor in the IGBT mode is reduced due to the contact-type FET effect.

In addition, both the EST and FET controlled thyristor suffer from such problems that the maximum current (limit current) that can flow through the device is large, and the device exhibits low breakdown withstand capability upon short-circuiting of a load.

SUMMARY OF THE INVENTION

It is therefore an object of the present invention to provide an insulated gate thyristor which is able to uniformly resume the reverse-blocking ability of the pn junction upon turn-off of the thyristor, assuring enhanced turn-off withstand capability, and which exhibits high breakdown withstand capability upon short-circuiting of a load, while assuring a sufficiently low ON-state voltage.

To accomplish the above object, there is provided according to the present invention an insulated gate thyristor comprising: a first-conductivity-type base layer having a high resistivity; first and second second-conductivity-type base regions formed in selected areas of a surface layer of a first major surface of the first-conductivity-type base layer, the first second-conductivity-type base region including a second-conductivity-type well region; a first-conductivity-type source region formed in a selected area of a surface layer of the first second-conductivity-type base region; a first-conductivity-type emitter region formed in a selected area of a surface layer of the second second-conductivity-type base region; a gate electrode formed through a gate insulating film on a surface of the first second-conductivity-type base region, an exposed portion of the first-conductivity-type base layer, and a surface of the second second-conductivity-type base region, which surfaces and exposed portion are interposed between the first-conductivity-type source region and the first-conductivity-type emitter region; a first main electrode that contacts both an exposed portion of the first second-conductivity-type base layer and the first-conductivity-type source region; a second-conductivity-type emitter layer formed on a second surface of the first-conductivity-type base layer; a second main electrode that contacts the second-conductivity-type emitter layer; and an insulating film covering entire areas of surfaces of the second second-conductivity-type base region and the first-conductivity-type emitter region; wherein the second second-conductivity-type base region has a diffusion depth that is smaller than a larger one of diffusion depths of the first second-conductivity-type base region and the second-conductivity-type well region.

In the insulated gate thyristor constructed as described above, when a voltage is applied to the insulated gate electrode so that an inversion layer appears right under the gate electrode, the potential of the first-conductivity-type emitter region becomes equal to that of the first main electrode, through a channel of the MOSFET, whereby a thyristor consisting of the first-conductivity-type emitter region, second second-conductivity-type base region, first-conductivity-type base layer and second-conductivity-type emitter layer is turned on. Since electrons are uniformly injected from the entire first-conductivity-type emitter region upon turn-on of the thyristor, the device is rapidly switched to a thyristor mode, and the ON-state voltage is reduced. The turn-on operation of the present device does not require hole current that flows in the Z-direction through the second second-conductivity-type base region as in the conventional EST. Upon turn-off, on the other hand, the pn junction can uniformly resume its reverse-blocking ability, causing no current concentration, with a result of increased breakdown withstand capability. Further, the diffusion depth of the second second-conductivity-type base region is controlled to be smaller than the larger one of those of the first second-conductivity-type base region and second-conductivity-type well region, whereby the concentration of the electric field can be avoided upon application of voltage, resulting in high withstand voltage and increased breakdown withstand capability of the device.

In one preferred form of the invention, the second second-conductivity-type base region has a surface impurity concentration that is lower than that of the first second-conductivity-type base region. In this case, the conductivity of the inversion layer that appears in the surface of the second second-conductivity-type base region upon application of voltage to the gate electrode is improved.

In another preferred form of the invention, the first-conductivity-type source region comprises a first region having a first surface impurity concentration, and a second region having a second surface impurity concentration that is lower than the first surface impurity concentration. In this case, the first main electrode is in contact with a surface of the first region having a higher surface impurity concentration than the second region.

In the above arrangement, the second region of the first-conductivity-type source region having the lower surface impurity concentration provides a limit resistance, and the limit current is reduced due to the limit resistance. Further, the contact resistance is not increased due to the presence of the first region of the first-conductivity-type source region having a relatively high surface impurity concentration.

In a further preferred form of the invention, the insulated gate thyristor further includes a first conductivity-type auxiliary region formed in the exposed portion of the first-conductivity-type base layer between the first and second second-conductivity-type base regions. The first-conductivity-type auxiliary region has an impurity concentration that is higher than that of the first-conductivity-type base layer, and has a diffusion depth that is smaller than those of the first and second second-conductivity-type base regions. In this arrangement, the contact-type FET effect can be reduced, and an effective channel length can be reduced, resulting in reduction of the ON-state voltage.

In a still further preferred form of the invention, a first part of the gate insulating film on the exposed portion of the first-conductivity-type base layer which is interposed between two of the first second-conductivity-type base region has a greater thickness than a second part of the gate insulating film on the exposed portion of the first-conductivity-type base layer which is interposed between the first and second second-conductivity-type base regions. In this arrangement, the gate capacity can be reduced, and high-frequency oscillation components can be reduced.

Preferably, at least one of the first and second second-conductivity-type base regions, the first-conductivity-type emitter region and the first-conductivity-type source region has one of polygonal, circular and elliptical shapes. In this case, the semiconductor substrate can be utilized with increased efficiency, and the current flowing through the device can be uniformly distributed, assuring improved thermal balance.

In particular, the first second-conductivity-type base region and the first-conductivity-type source region formed in the surface layer thereof are preferably formed so as to surround the second second-conductivity-type base region, or a plurality of first second-conductivity-type base regions are preferably formed around the second second-conductivity-type base region. In these arrangements, the current flowing from the first-conductivity-type emitter region to the first-conductivity-type source region through the channel is distributed, thus avoiding current concentration or localization.

It is also preferable that the plurality of first second-conductivity-type base regions and first-conductivity-type source regions formed in their surface layers are formed around the second second-conductivity-type base region, and the gate electrode having a substantially annular shape is provided so as to surround the insulating film on the second second-conductivity-type base region, while the first main electrode is provided through an insulating film on one side of the gate electrode remote from the second second-conductivity-type base region. In this arrangement, an accumulation layer is formed in the surface layer of the first-conductivity-type semiconductor layer underlying the gate electrode, resulting in reduction in the ON-state voltage.

Preferably, a contact portion between the first main electrode and the first second-conductivity-type base region and the first-conductivity-type source region has a shape selected from a polygonal shape, a circular shape and an elliptical shape. In this case, the semiconductor substrate can be utilized with improved efficiency, and the current flowing through the device can be uniformly distributed, assuring improved thermal balance.

A first surface portion of the first-conductivity-type source region which is opposed to the second second-conductivity-type base region is preferably covered with an insulating film, and a second surface portion of the first-conductivity-type source region which is opposed to the first second-conductivity-type base region is preferably in contact with the first main electrode (cathode). In this arrangement, the current flowing from the first-conductivity-type emitter region to the first-conductivity-type source region through an inversion channel right under the gate electrode does not flow through a portion close to the first-conductivity-type emitter region, thus avoiding latch up of a parasitic transistor. Further, the limit current is reduced due to the effect of ballast resistance, and the breakdown withstand capability is thus increased.

The diffusion depth of the first-conductivity-type emitter region is preferably greater than that of the first-conductivity-type source region. In this case, the injection of electrons is increased in a thyristor portion, and the current amplification factor of the transistor is increased, with a result of reduction in the ON-state voltage.

Preferably, lifetime killers are present in local portions of the thyristor. In this case, the lifetime distribution of carriers can be optimally controlled, such that no lifetime killers are present in unnecessary portions, thus avoiding an increase in the ON-state voltage and other adverse influences.

The insulated gate thyristor of the present invention may further include a first-conductivity-type buffer layer having a higher impurity concentration than the first-conductivity-type base layer, between the first-conductivity-type base layer and the second-conductivity-type emitter layer. In this arrangement, the first-conductivity-type buffer layer having a high impurity concentration prevents a depletion layer from expanding, thus making it possible to reduce the thickness of the first-conductivity-type base layer. This structure is suitable for a high-voltage insulated gate thyristor.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

In the process of developing the conventional EST to produce prototypes of various insulated gate thyristors, in an attempt to solve the above-described problems, the inventors of the present invention found that there is no need to contact the first main electrode with the second second-conductivity-type base region, and that even if the surface of the second second-conductivity-type base region is covered with an insulating film, the resulting device can be switched to the thyristor mode, assuring a good trade-off characteristic between the ON-state voltage and the turn-off time. The inventors also made a further analysis on patterns as viewed in the plane of the devices and impurity concentrations.

As a result of the analysis, it was found that the withstand voltage characteristic and ON-state voltage are improved by varying the diffusion depths and impurity concentrations of the first and second second-conductivity-type base regions. It was also found that a good effect or influence on the device arises by each of the following measures: forming the first-conductivity-type source region from two regions having high and low impurity concentrations, forming a high-concentration auxiliary region in a surface layer of the first-conductivity-type base layer, and varying the thickness of a local portion or portions of the gate oxide film.

The first and second second-conductivity-type base regions may be in the form of stripes that extend in parallel with each other, or may have a polygonal, circular or elliptical shape. If the first second-conductivity-type base region is disposed so as to surround the second second-conductivity-type base region, the current concentration can be reduced or avoided, and thus the device provides an improved trade-off characteristic. A plurality of first second-conductivity-type base regions may be advantageously formed around the second second-conductivity-type base region. It is also advantageous to vary the diffusion thickness of the first-conductivity-type emitter region, and provide lifetime killers in local areas of the thyristor.

Figure 17:
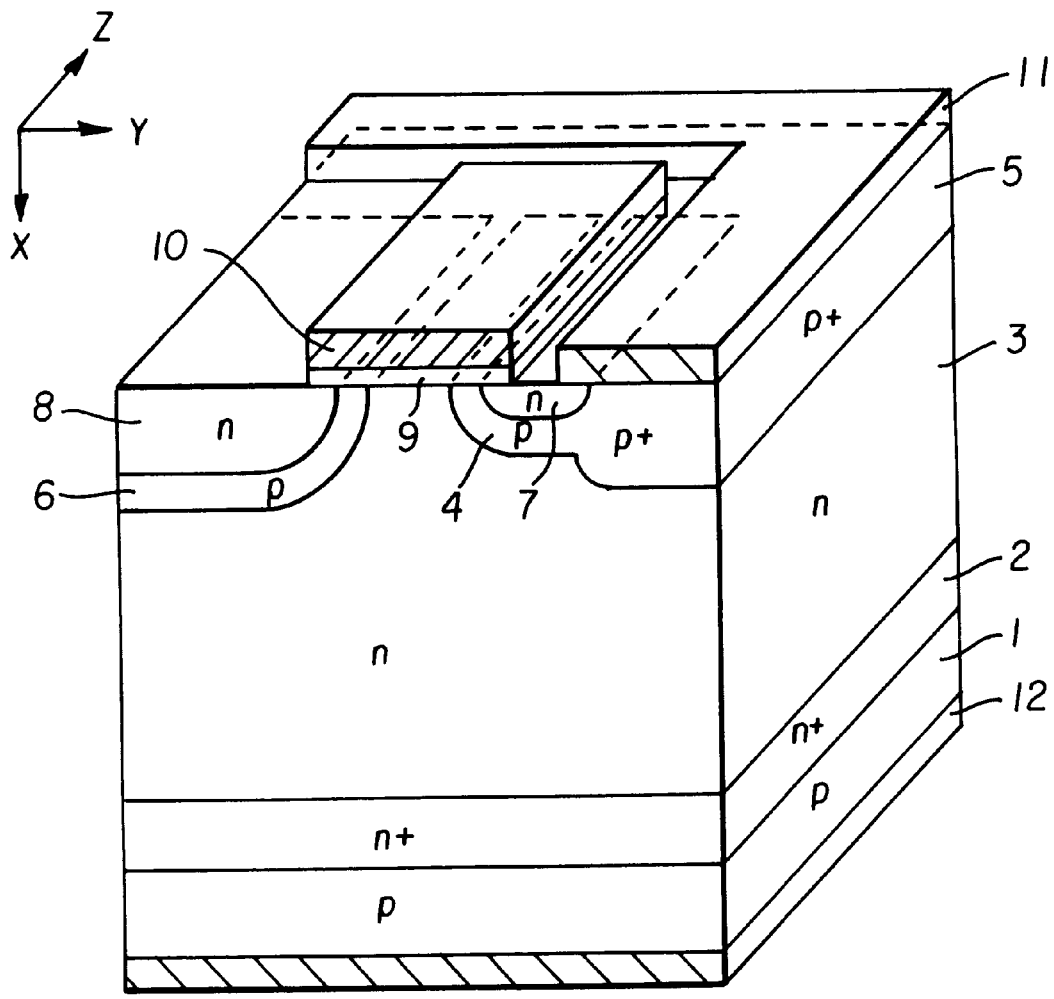
FIG. 17 is a perspective view showing an EST cut in a unit cell.

Some embodiments of the present invention will be now described, referring to the drawings in which the same reference numerals as used in FIG. 17 are used to identify structurally and/or functionally corresponding elements. In the following description, "n" or "p" prefixed to a region or layer means that the relevant region or layer has electrons or holes, respectively, as majority carriers. While the first conductivity type is n type and the second conductivity type is p type in the following embodiments, the first and second conductivity types may be reversed, namely, may be p type and n type, respectively.

First Embodiment

Figure 1:
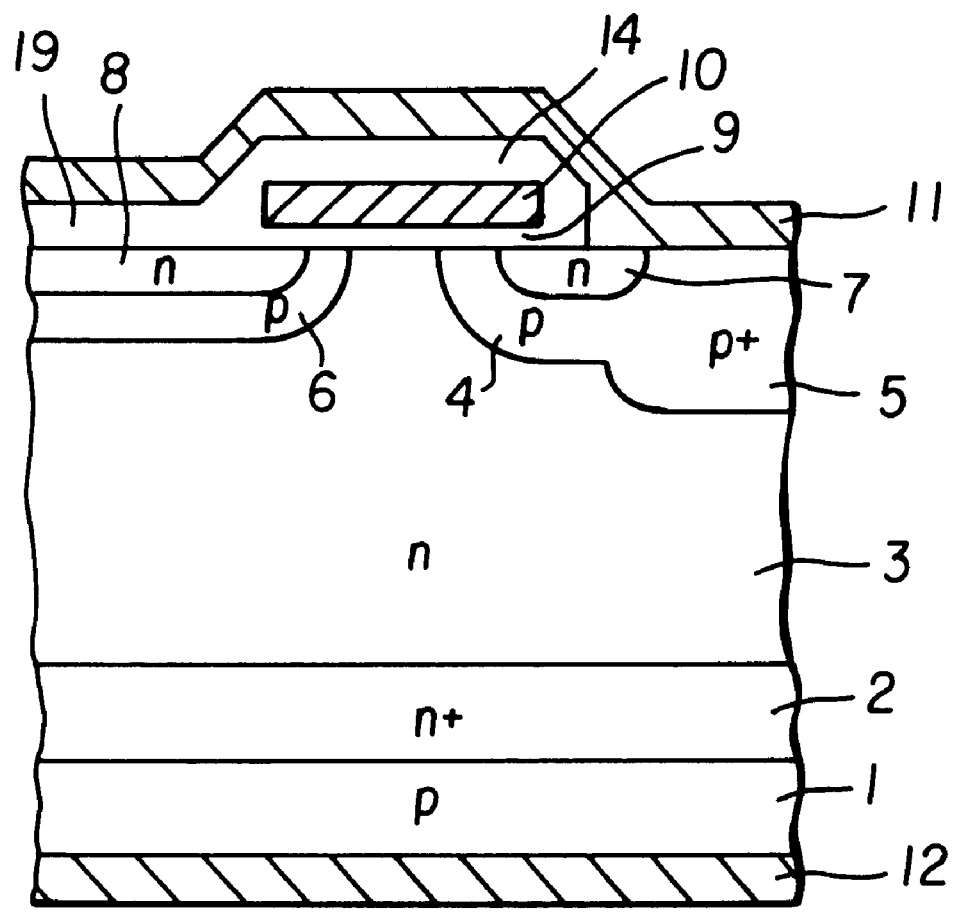
FIG. 1 is a cross sectional view showing a part of an insulated gate thyristor according to the first embodiment of the present invention.

FIG. 1 is a cross sectional view showing a part of an insulated gate thyristor constructed according to the first embodiment of the present invention. While this cross sectional view shows one unit cell of the thyristor, a multiplicity of unit cells are actually inversed and repeated to constitute the semiconductor device. The insulated gate thyristor of FIG. 1 has a semiconductor substrate portion which is structurally similar to that of the EST of FIG. 17. More specifically, a first p base region 4 and a second p base region 6 are formed in a surface layer of one of opposite surfaces of an n base layer 3 having a high resistivity, such that these base regions 4, 6 are spaced apart from each other. Further, a $p^+$ well region 5 having a greater diffusion depth than the first p base region 4 is formed in a part of the first p base region 4 so as to avoid latch up of a parasitic thyristor. A p emitter layer 1 is formed on the other surface of the n base layer 3, through an $n^+$ buffer layer 2. An n source region 7 is formed in a selected portion of a surface layer of the first p base region 4, and an n emitter region 8 is formed in a selected portion of a surface layer of the n emitter region 8. As in the thyristor of FIG. 17, a gate electrode 10 is formed through a gate oxide film 9 over the surfaces of the first p base region 4, an exposed portion of the n base layer 3 and second p base region 6, which are interposed between the n source region 7 and the n emitter region 8, to thus provide an n-channel lateral MOSFET. The surface of the MOSFET on the side of the gate electrode 10 is covered with an insulating film 14 made of phosphorus glass (PSG), and a contact hole is formed through the insulating film 14 so that a cathode electrode 11 contacts both of the surfaces of the first p base region 4 and n source region 7. The surface of the n emitter region 8 is covered with an insulating film 19. An anode electrode 12 is provided on the surface of the p emitter layer 1.

Figure 2A:
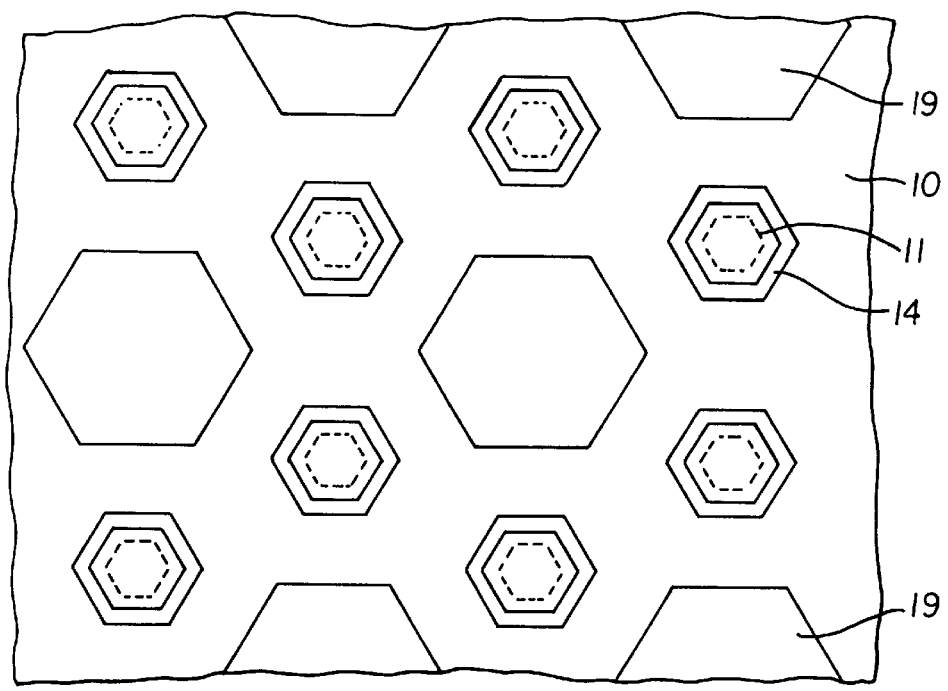
FIG. 2(a) is a cross sectional view taken across a horizontal plane extending through the middle of gate electrode of the insulated gate thyristor of the first embodiment of FIG. 1.

FIG. 2(a) is a cross sectional view taken across a horizontal plane extending through the middle of the gate electrode 10 of the insulated gate thyristor according to the first embodiment of the invention. In FIG. 2(a), the same reference numerals as used in FIG. 1 are used to identify corresponding elements. As shown in FIG. 2(a), hexagonal insulating films 19 are provided in the network of the gate electrode 10, and hexagonal cathode electrode electrodes 11 each surrounded by the insulating film 14 are disposed around each of the insulating films 19. This pattern of the gate electrode 10, insulating film 19, cathode electrodes 11 and insulating films 14 are repeated in the insulated gate thyristor. While the cathode electrode 11 has a hexagonal shape in the cross section of FIG. 2(a), the cathode electrode 11 in the actual device often extends over the gate electrode 10 through the insulating film 14, as seen in the cross sectional view of FIG. 1.

Figure 2B:
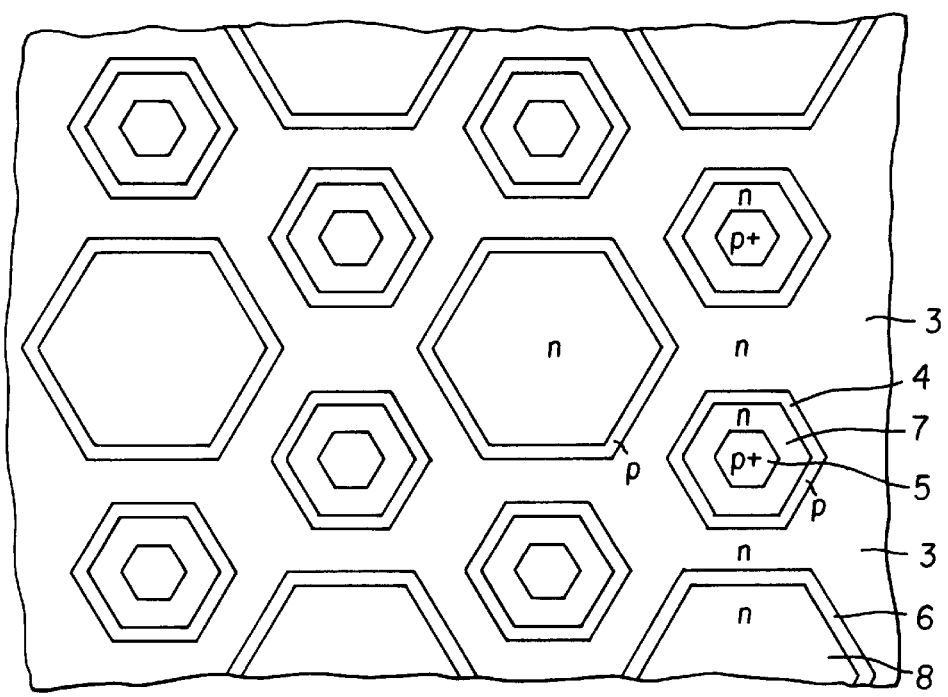
FIG. 2(b) is a plan view showing the surface of a silicon substrate of this insulated gate thyristor.

FIG. 2(b) is a plan view showing respective diffusion regions formed in the surface of the silicon substrate of the insulated gate thyristor of FIG. 1, from which insulating films and electrodes are removed. The n emitter regions 8 are formed in portions of the silicon substrate located under the hexagonal insulating films 19, shown in FIG. 2(a), and each of the regions 8 is surrounded by the second p base region 6. Substantially annular n source regions 7 with hexangular contours, and $p^+$ well regions 5 inside the n source regions 7 are formed in portions of the silicon substrate located under the cathode electrodes 11, and each of the regions 7 is surrounded by the first p base region 4. The n base layer 3 is exposed between the first p base regions 4 and the second p base regions 6 and between adjacent two first p base regions 4. The first p base regions 4, second p base regions 6 and exposed portion of the n base layer 3 are present under the gate electrode 10 of FIG. 2(a).

The insulated gate thyristor of the first embodiment may be produced in substantially the same process in which the conventional IGBT is produced, using different masks for forming respective diffusion regions. To produce a 600V-class device, for example, 10 μm-thickness n layer having a resistivity of 0.1Ω·cm that provides the $n^+$ buffer layer 2, and 55 μm-thickness n layer having a resistivity of 40Ω·cm that provides the n base layer 3 are epitaxially grown on 450 μm-thickness p type silicon substrate having a resistivity of 0.02Ω·cm, so as to provide an epitaxial wafer. The first and second p base regions 4, 6 and p emitter layer 1 are formed by implantation of boron ions and thermal diffusion, and the n emitter region 8 and n source region 7 are formed by implantation of arsenic ions and phosphorus ions and thermal diffusion. The edges of the first p base region 4, second p base region 6, n source region 7 and n emitter region 8 are determined by the gate electrode 10 formed of polycrystalline silicon and others on the semiconductor substrate, and spacings between these regions 4, 6, 7 and 8 are determined by diffusion of the respective regions in the lateral directions. The cathode electrode 11 is made of an Al alloy and formed by sputtering, and the anode electrode 12, which is to be soldered to a metallic substrate, consists of three layers of Ti, Ni and Au that are formed in lamination by sputtering. The device is irradiated with helium ions, to control the lifetime of carriers to thereby reduce the switching time. The irradiation with helium ions is a method for producing crystal defects that provide lifetime killers in local portions of the device, and is effected under conditions of an accelerating voltage of 24 MeV and a dose amount of $1\times10^{11}$ to $1\times10^{12}$ cm$^{-2}$. After the irradiation, the device is annealed at 350–375° C.

The diffusion depth of the $p^+$ well region 5 is 7 μm, and those of the first and second p base regions 4, 6 are 3 μm. The diffusion depths of the n emitter region 8 and n source region 7 are 2 μm and 0.4 μm, respectively. With the diffusion depth of the respective regions thus controlled, the pnp transistor of the thyristor portion has an increased current amplification factor, and shows a reduced ON-state voltage. The width of the gate electrode 10 as measured between the first and second p base regions is 15 μm, and the width of the electrode 10' as measured between two of the first p base regions 4 is 30 μm, while the width of the n source region 7 is 4 μm. The cell pitch is 55 μm. The portion of the n emitter region 8 that is close to the first p base region 4 has substantially the same depth as the n source region 7, with the withstand voltage taken into consideration.

The operation of the insulated gate thyristor constructed as described above will be now described. When the cathode electrode 11 is ground, and a positive voltage that is equal to or greater than a certain value (threshold) is applied to the gate electrode 10, 10' while a positive voltage is applied to the anode electrode 12, an inversion layer (partial accumulation layer) is formed under the gate oxide film 9, and the lateral MOSFET is turned on. As a result, electrons are initially supplied from the cathode electrode 11 to the n base layer 3, through the n source region 7, and the channel of the MOSFET formed in the surface layer of the first p base region 4. These electrons function as base current for a pnp transistor which consists of the p emitter layer 1, $n^+$ buffer layer 2, n base region 3, and the p base region 4 ($p^+$ well region 5). Thus, the transistor operates in the IGBT mode with this base current.

With the pnp transistor thus turned on, holes are injected from the p emitter layer 1, and flow into the first p base region 4, through the $n^+$ buffer layer 2 and the n base layer 3. With the second p base region 6 being in the state of floating, the potential of the second p base region 6 is gradually increased due to the hole current flowing through the n base layer 3. As is understood from the cross sectional view of FIG. 1, when the transistor is on, the potential of the n emitter region 8 is kept substantially equal to that of the n source region 7 through the channel of the MOSFET, and therefore electrons begin to be injected from the n emitter region 8 into the second p base region 6 after a while. Thus, a thyristor portion consisting of the p emitter layer 1, $n^+$ buffer layer 2, n base layer 3, second p base region 6 and the n emitter region 8 operates in the thyristor mode.

Upon turn-off, the potential of the gate electrode 10, 10' is lowered below the threshold of the lateral MOSFET, to turn off the lateral MOSFET, so that the n emitter region 8 is electrically cut off from the cathode electrode 11, and the operation of the thyristor portion is thus stopped.

In the insulated gate thyristor of FIG. 1, both of the surfaces of the second p base region 6 and n emitter region 8 are covered with the insulating film 14, and the second p base region 6 is not in contact with the cathode electrode 11. Further, the diffusion depth of the second p base region 6 is smaller than that of the $p^+$ well region 5.

When the transistor is turned on, therefore, the potential of the n emitter region 8 is kept substantially equal to that of the cathode electrode 11, through the channel formed right under the gate electrode 10. As a result, the potential of the second p base region 6 is gradually increased due to the hole current flowing through the n base layer 3, until electrons begin to be injected from the n emitter region 8 into the second p base region 6. In this manner, the thyristor consisting of the n emitter region 8, second p base region 6, n base layer 3 and p emitter layer 1 is turned on. Thus, the IGBT mode can be rapidly switched to the thyristor mode, without requiring the hole current flowing in the Z direction in the second p base region as in the conventional EST. Further, the ON-state voltage is lowered since the electrons are uniformly injected from the n emitter region 8 as a whole.

Upon turn-off, on the other hand, the pn junction between the n emitter region 8 and the second p base region 6 can uniformly resume its reverse-blocking ability due to the potential difference therebetween, whereby current localization or concentration can be avoided, assuring a significantly increased reverse bias safe operation area (RBSOA). Further, since a plurality of first p base regions 4 having the n source regions 7 in their surface layers are disposed around the second p base region 6, as shown in FIG. 2(b), the device of this embodiment is free from current concentration or localization, and exhibits high breakdown withstand capability. The breakdown withstand capability is increased partly because the current concentration upon application of a high voltage can be avoided by controlling the diffusion depth of the second p base region 6 to be smaller than that of the p+ well region 5.

The structure as shown in FIG. 1 may be applied to thyristors having various patterns other than that of FIG. 2, including patterns in which the first p base regions are disposed so as to surround the second p base regions, and patterns in which both the first and second p base regions are in the form of stripes or have a rectangular shape.

Second Embodiment

Figure 3:
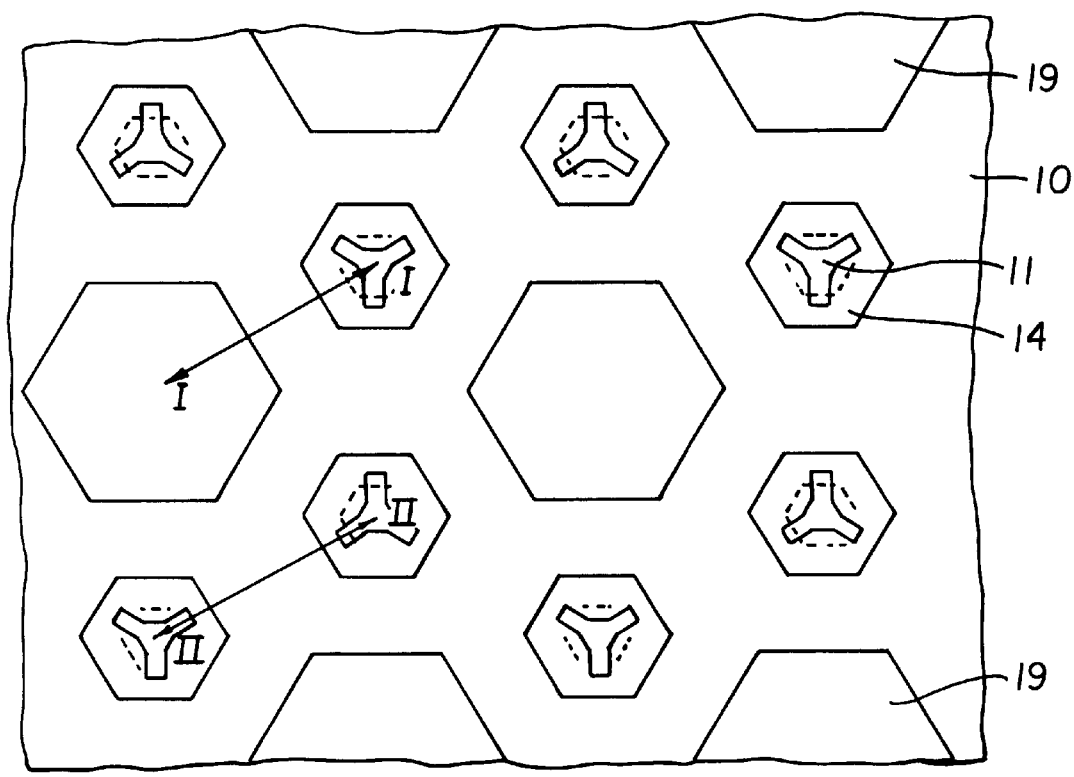
FIG. 3 is a cross sectional view taken across a horizontal plane extending through the middle of gate electrode of an insulated gate thyristor according to the second embodiment of the invention.

FIG. 3 is a cross sectional view of an insulated gate thyristor according to the second embodiment of the present invention, taken across a plane extending through the middle of the gate electrode 10 of the insulated gate thyristor. In this embodiment, hexagonal insulating films 19 and hexagonal insulating films 14 are formed in the network of the gate electrode 10, and cathode electrodes 11 that protrude in three directions toward the oxide films are formed inside the insulating films 14. The insulating films 14 having the cathode electrodes 11 therein are disposed around each of the insulating films 19 that do not have the cathode electrodes 11. The dotted lines in FIG. 3 indicate pn junctions between the n source regions 7 and the p+ well regions 5.

A plan view showing respective diffusion regions formed in the surface of the silicon substrate of the insulated gate thyristor of the second embodiment, from which insulating films and electrodes are removed, is similar to that of FIG. 2(b). Namely, the n emitter regions 8 are formed in portions of the silicon substrate located under the hexagonal insulating films 19, and each of the regions 8 is surrounded by the second p base region 6. The cathode electrodes 11 is in contact with the surfaces of a part of the n source region 7 and the p+ well region 5. Most of the portion underlying the gate electrode 10 consists of the exposed portion of the n base layer 3.

Figure 4A:
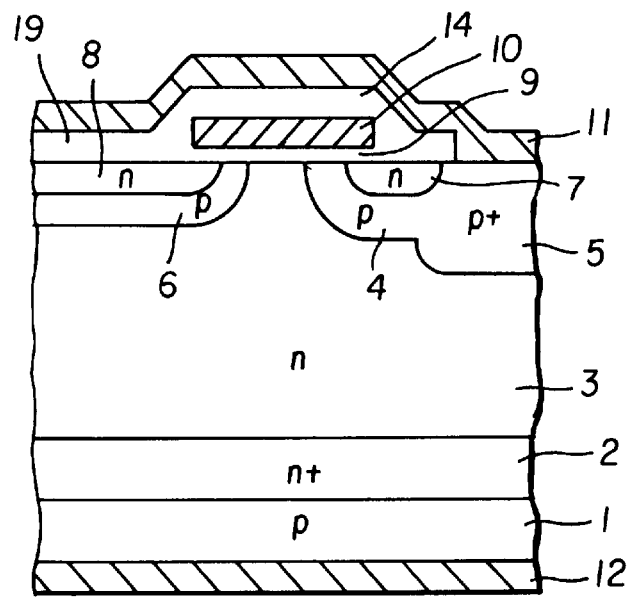
FIG. 4(a) is a cross sectional view taken along line A–A' of FIG. 3.

FIG. 4(a) is a cross sectional view taken along line I–I' of FIG. 3 connecting the insulating film 19 and the cathode electrode 11. While the structure shown in cross section in FIG. 4(a) is similar to that of the first embodiment of FIG. 1, the entire surface of the n source region 7 is covered with the insulating film 4, and does not contact with the cathode electrode 11. Namely, the cathode electrode 11 is in contact only with the surface of the p+ well region 5.

Figure 4B:
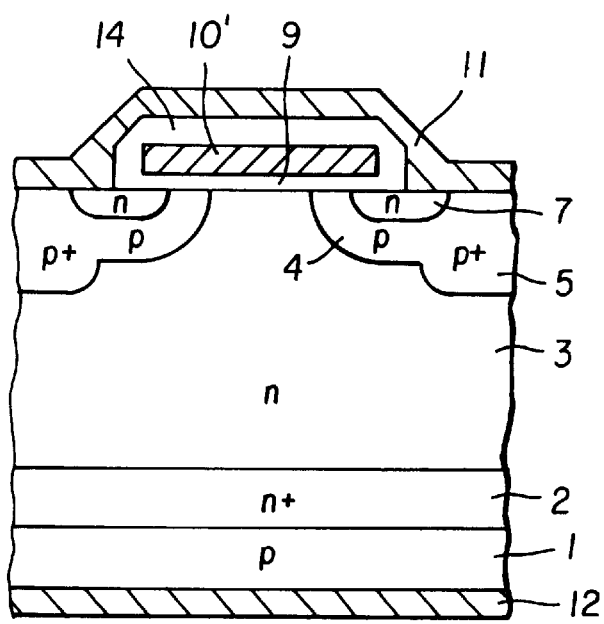
FIG. 4(b) is a cross sectional view taken along line B–B' of FIG. 3.

On the other hand, FIG. 4(b) is a cross sectional view taken along line II–II' of FIG. 3 connecting one of the cathode electrodes 11 with another cathode electrode 11. In this cross section, the cathode electrode 11 is in contact with both of the surfaces of the first p base region 4 and n source region 7, as in the insulated gate thyristor of the first embodiment.

The insulated gate thyristor having the pattern of FIG. 3 can be produced in substantially the same process as the insulated gate thyristor of the first embodiment, and the operation of the thyristor of FIG. 3 is also similar to that of the first embodiment, and thus will not be described herein.

As in the first embodiment, the insulated gate thyristor of the second embodiment is constructed such that the diffusion depth of the second p base region 6 is made smaller than that of the p+ well region 5, so as to avoid current concentration upon application of a high voltage, and thereby assure increased breakdown withstand capability.

In the insulated gate thyristor of the second embodiment, the surfaces of the second p base region 6 and the n emitter region 8 formed in its surface layer are covered with the insulating film 19, as shown in FIG. 4(a). In this arrangement, the thyristor consisting of the n emitter region 8, second p base region 6, n base layer 3 and p emitter layer 1 is uniformly turned on and off, assuring a rapid switching characteristic and a large reverse bias safe operation area (RBSOA), as explained with respect to the operation of the first embodiment. Further, the insulating film 14 covers the surface of the n source region 7 formed in a part of the first p base region 4 which is close to the second p base region 6 and n emitter region 8, so that the relevant part of the n source region 7 does not contact the cathode electrode 11. Upon turn-off when the current flows from the n emitter region 8 of the thyristor portion to the n source region 7, through an inversion layer formed right under the gate electrode 10, therefore, the n source region 7 close to the second p base region 6 is not short-circuited with the cathode electrode 11, thus preventing latch up of a parasitic thyristor consisting of the n source region 7, first p base region 4, n base layer 3 and the p emitter layer 1. Accordingly, the turn-off time can be advantageously reduced, as compared with the conventional device wherein the turn-off time is increased due to injection of electrons from the n source region 7.

Although the cathode electrode 11 is in contact with the n source region 7 in the portion of the device where the n source regions 7 face each other, as seen in FIG. 4(b), this portion is not likely to cause latch-up since the p+ well region 5 having a high impurity concentration is formed in a lower part of the first p base region 4.

Figure 5:
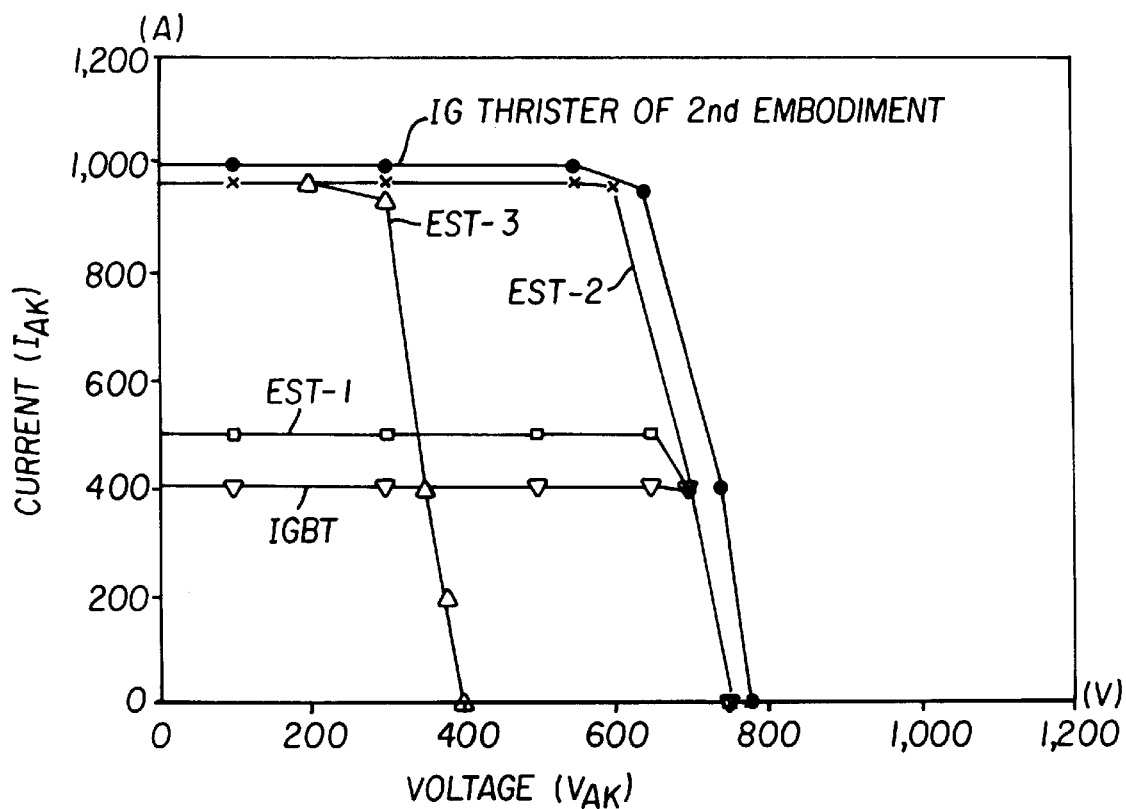
FIG. 5 is a graph showing the RBSOAs of 600V-class devices of the second embodiment and comparative examples.
Figure 6:
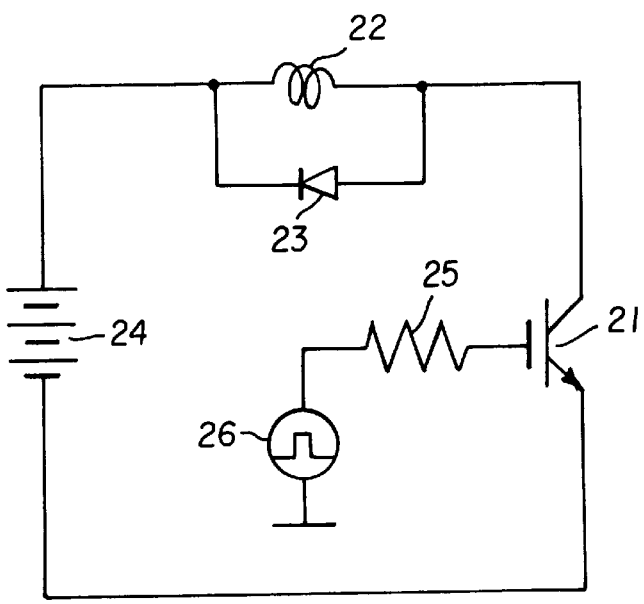
FIG. 6 is a circuit diagram for measuring the RBSOA.
Figure 18:
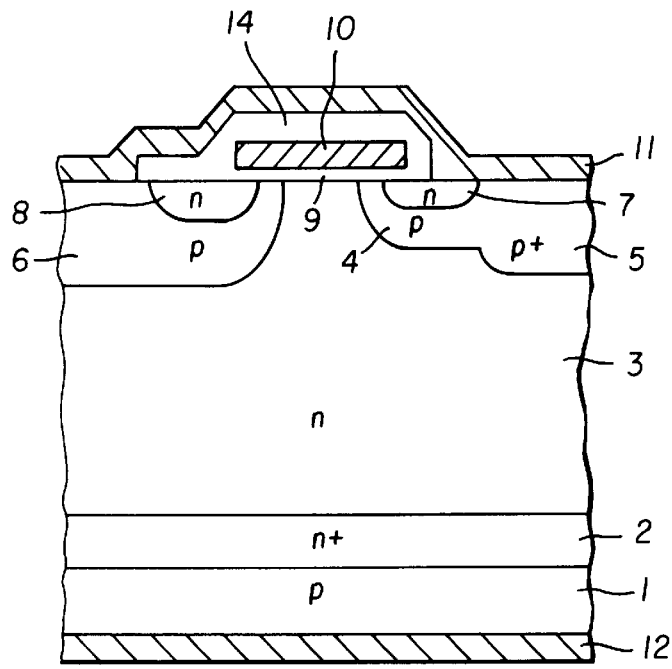
FIG. 18 is a cross sectional view showing an improved EST.
Figure 19:
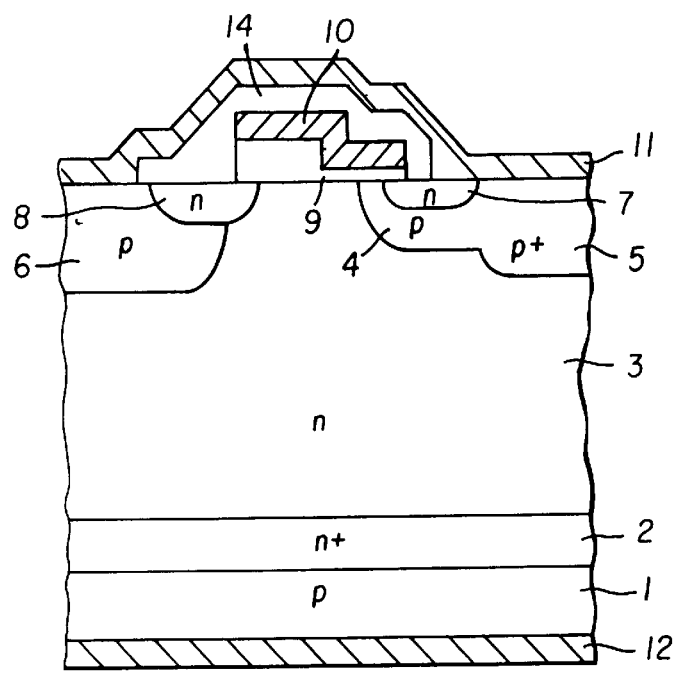
FIG. 19 is a cross sectional view showing another improved EST.
Figure 20:
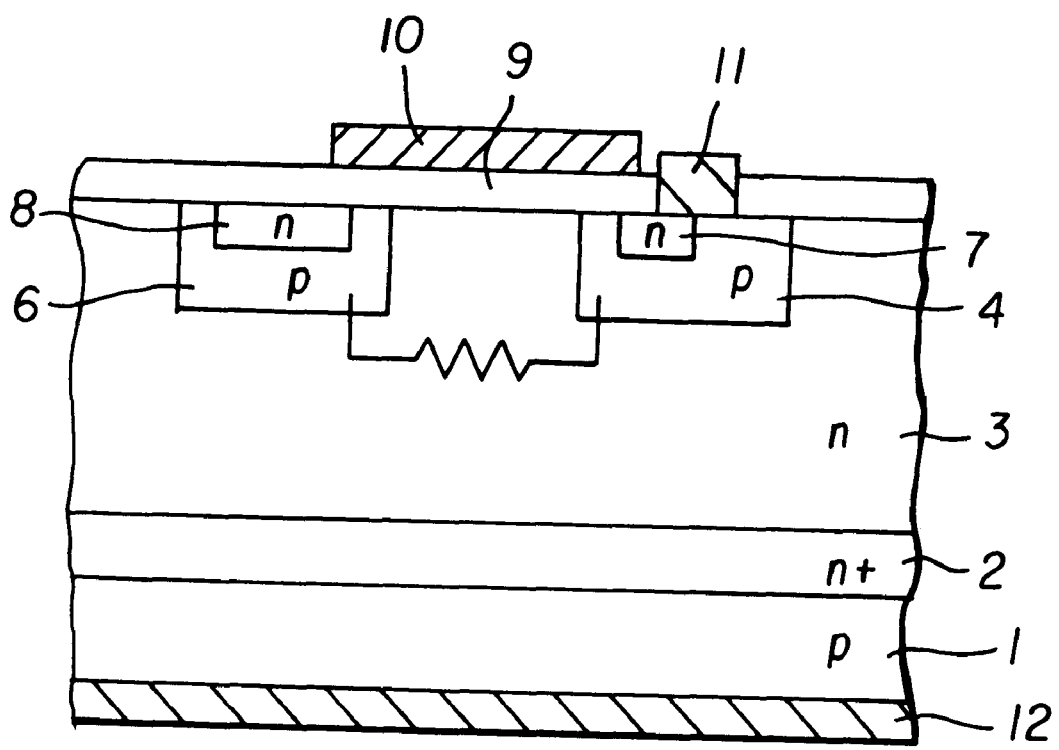
FIG. 20 is a cross sectional view showing a FET controlled thyristor.

The graph of FIG. 5 shows results of measurements of the reverse bias safe operation areas (RBSOA) of the insulated gate thyristor of the second embodiment shown in FIG. 3, ESTs as comparative examples, including EST-1 as shown in FIG. 17, EST-2 as shown in FIG. 18, and EST-3 as shown in FIG. 19, and an IGBT as another comparative example. The RBSOA was measured at 125° C. with a measuring circuit as shown in FIG. 6. In the graph of FIG. 5, the axis of abscissa indicates voltage ($V_{AK}$) between the anode and the cathode, and the axis of ordinates indicates electric current ($I_{AK}$).

In FIG. 6, a device 21 to be measured is connected to a dc power supply 24, through a 1 mH inductor 22 and a free-wheeling diode 23 that are connected in parallel with each other, and a gate of the device 21 is connected to a gate power supply 26, through a resistor 25 of 20Ω.

The devices shown in FIG. 5 were produced as 600V-class devices, and the devices of the comparative examples were produced using epitaxial wafers having the same specification as that of the insulated gate thyristor of the first embodiment as described above. The n emitter region 8 of both of EST-2 and EST-3 had a width of 20 µm. All of the five devices of FIGS. 3, 17, 18, 19 and IGBT had a chip size of 1 cm². The ON-state voltages, as defined by a fall of the potential occurring upon conduction of 100 A current, were 0.9 V for the insulated gate thyristor of the second embodiment, 1.6 V for the EST-1, 1.7 V for the EST-2, 1.0 V for the EST-3, and 2.3 V for the IGBT. It will be understood from FIG. 5 that the device of the second embodiment of the invention has a lower ON-state voltage than the other devices, and has a safe operation area that is three times as large as that of the IGBT, and twice as large as those of the EST-1 and EST-3, which means that the present device exhibits high breakdown withstand capability. While the present device exhibits substantially the same degree of breakdown withstand capability as the EST-2, it is still advantageous over the EST-2 because of the lower ON-state voltage. Thus, according to the present invention, the ON-state voltage can be lowered without affecting other characteristics. This is because the current concentration does not occur in the arrangement in which the n emitter region 8 and second p base region 6 are formed in polygonal shape, and these regions 8, 6 are surrounded by a plurality of first p base regions 4.

Figure 10:
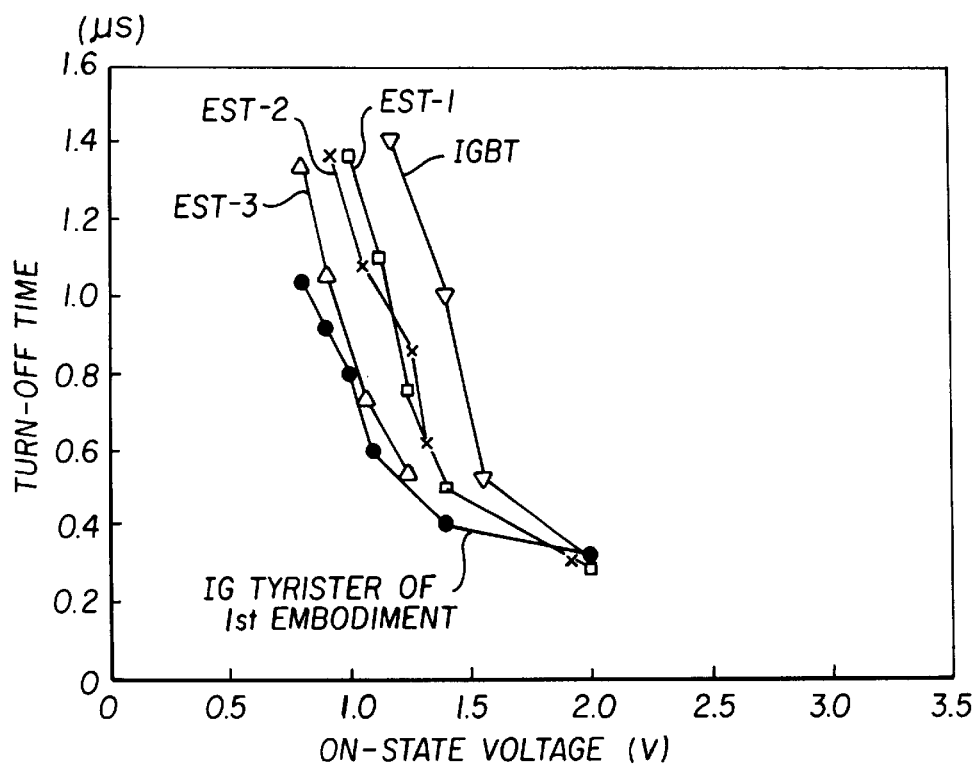
FIG. 10 is a graph showing trade-off characteristics between the ON-state voltage and turn-off time of 600V-class devices of the first embodiment and comparative examples.

The graph of FIG. 10 shows a trade-off characteristic between the ON-state voltage and the turn-off time of the 600V devices as described above. The axis of abscissa indicates the ON-state voltage, and the axis of ordinates indicates the turn-off time. The ON-state voltage was defined by a fall of the potential occurring at 25° C. when 100 A·cm$^{-2}$ current was conducted through the device. The turn-off time was measured at 125° C. It will be understood from FIG. 10 that the device of the second embodiment shows a better trade-off characteristic than the ESTs and IGBT.

The better trade-off characteristic is achieved because the latch up of the parasitic thyristor is prevented by covering the surface of the n source region 7 close to the second p base region 6, with the insulating film 14. In the second embodiment, in particular, the lifetime control is effected by implanting helium ions, to produce crystal defects providing lifetime killers in local portions of the device, to thus optimize the distribution of the lifetime killers. Thus, the lifetime killers do not appear in unnecessary portions, resulting in a further improved trade-off characteristic between the ON-state voltage and the turn-off time.

Another specimen of insulated gate thyristor was produced in which the lifetime control was effected by irradiation of protons. The dose amount was substantially equivalent to that of the helium ions as used in the second embodiment. The thus produced device exhibited substantially the same characteristics as the second embodiment in which the lifetime control was effected by irradiation of helium ions.

Third Embodiment

Figure 7A:
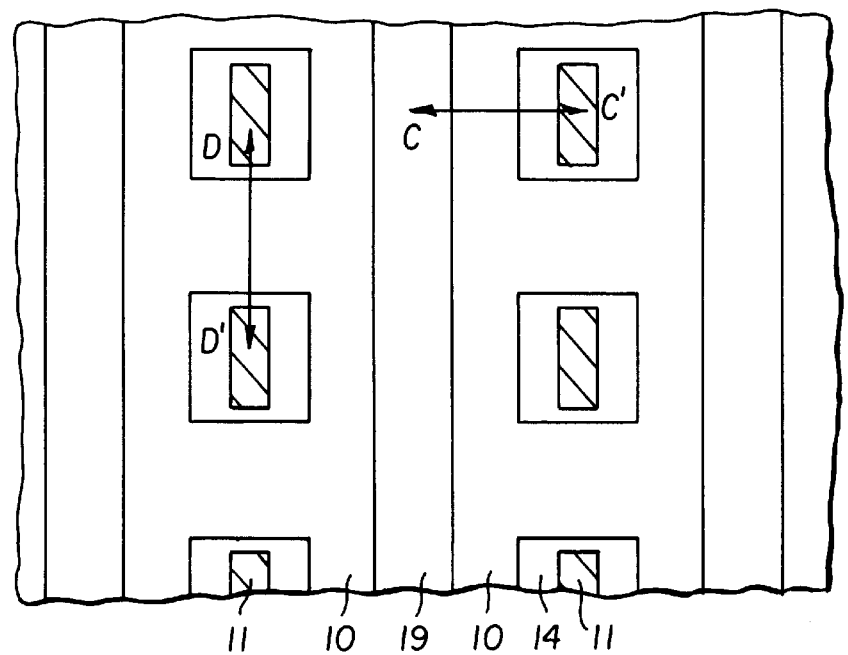
FIG. 7(a) is a cross sectional view taken across a horizontal plane extending through the middle of gate electrodes of an insulated gate thyristor as the third embodiment of the present invention.

FIG. 7(a) is a cross sectional view of an insulated gate thyristor according to the third embodiment of the present invention, taken across a plane extending through the middle of gate electrodes. In FIG. 7(a), stripe-shaped insulating films 19 and ladder-shaped gate electrodes 10 are arranged to extend in parallel with each other, and cathode electrodes 11 surrounded by insulating films 14 are seen in the gate electrodes 10. Although the cathode electrodes 11 having a rectangular shape are separated from each other in the cross sectional view of FIG. 7(a), these cathode electrodes 11 actually extend over the insulating films 14 and are connected to each other.

Figure 7B:
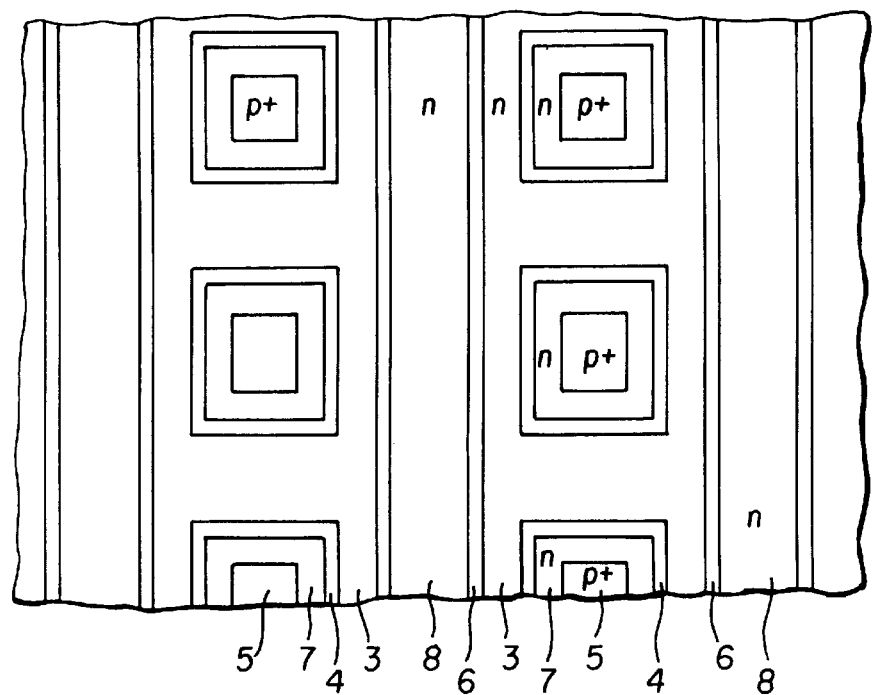
FIG. 7(b) is a plan view showing the surface of a silicon substrate of this insulate gate thyristor.

FIG. 7(b) is a plan view showing respective diffusion regions formed in the surface of the silicon substrate of the insulated gate thyristor of FIG. 7(a), from which the insulating films and electrodes are removed. As shown in the figure, n emitter regions 8 are formed in stripe-shaped second p base regions 6, and rectangular n source regions 7 having rectangular holes and p$^+$ well regions 5 are formed in rectangular first p base regions 4 formed in surface layers of ladder-shaped n base layers 3. Most of the portions of the silicon substrate located right under the gate electrode 10 of FIG. 7(a) consist of exposed portions of the n base layer 3. The cathode electrodes 11 are located above the n source regions 7 and p$^+$ well regions 5 for contact with these regions.

The cross section taken along line C–C' connecting the insulating film 19 and the cathode electrode 11 is identical with that shown in FIG. 4(a), and the cross section taken along line D–D' connecting two adjacent cathode electrodes 11 is identical with that shown in FIG. 4(b). In this cross section, the cathode electrode 11 is in contact with both of the surfaces of the first p base region 4 and n source region 7, as in the insulated gate thyristor of the first embodiment.

The insulated gate thyristor of the third embodiment has a different pattern as seen in the plane from that of the second embodiment, but provides substantially the same operating characteristics.

Fourth Embodiment

Figure 8A:
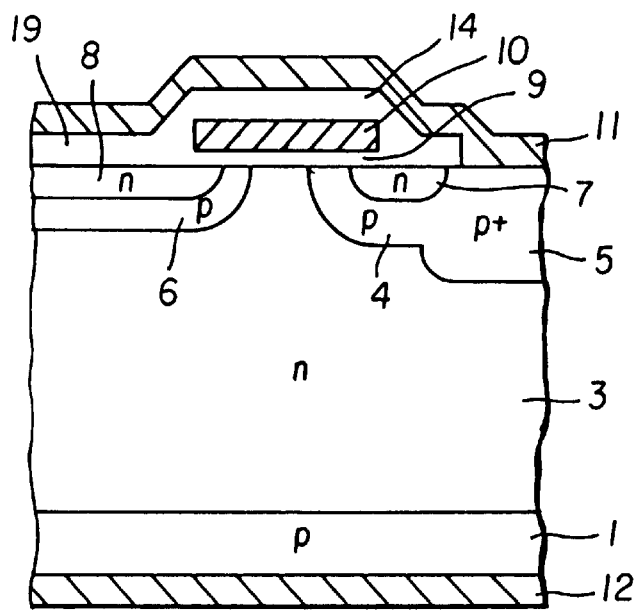
FIG. 8(a) and FIG. 8(b) are a cross sectional view showing a part of an insulated gate thyristor according to the fourth embodiment of the present invention.
Figure 8B:
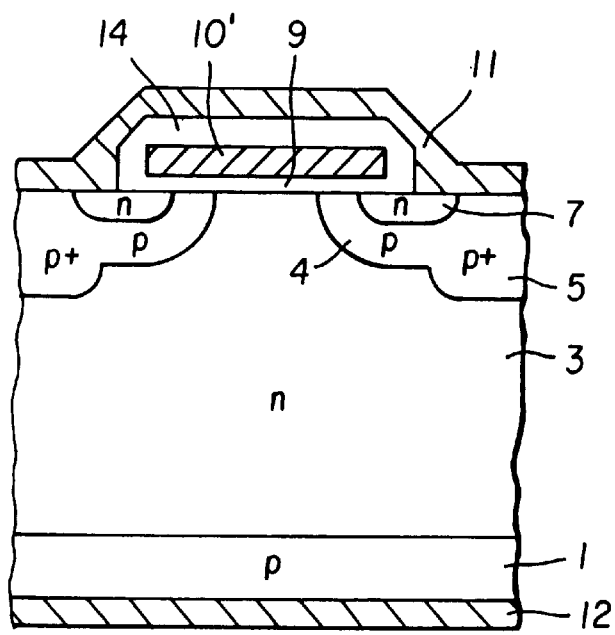

While the n$^+$ buffer layer 2 is provided between the p emitter layer 1 and the n base layer 3 in the devices of the first to third embodiments, the present invention is applicable to a similar device having no n$^+$ buffer layer 2. FIGS. 8(a) and 8(b) are cross sectional views showing a part of an insulated gate thyristor according to the fourth embodiment of the present invention, which is fabricated using a bulk silicon wafer, rather than an epitaxial wafer. Namely, while the structure on one of opposite main surfaces of the n base layer 3 formed of the bulk silicon wafer is the same as that of the second embodiment of FIG. 3, the p emitter layer 1 is directly formed on the other main surface of the n base layer 3.

Figure 9:
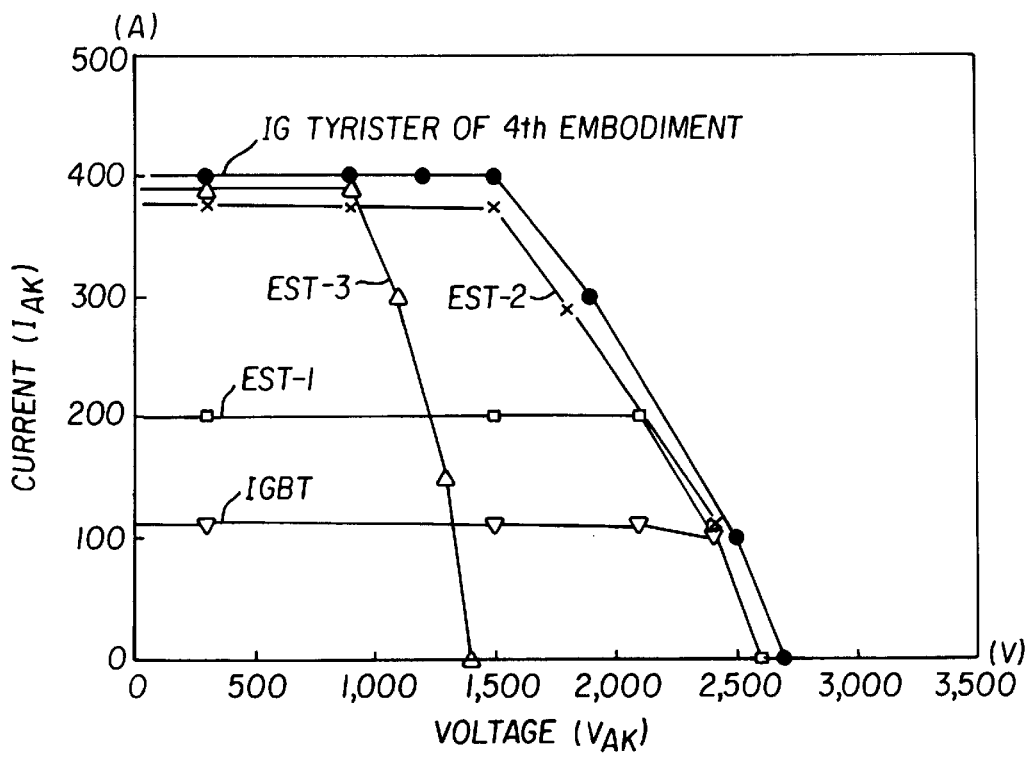
FIG. 9 is a graph showing the RBSOAs of 2500 devices of the fourth embodiment and comparative examples.

The graph of FIG. 9 shows a FIG. 9 shows results of measurements of the reverse bias safe operation areas (RBSOA) at 125° C. of the insulated gate thyristor of the fourth embodiment having the structure of FIG. 8 and the pattern of FIG. 4, EST-1, EST-2, EST-3 and IGBT, each of which was fabricated as a 2500V device. In the graph of FIG. 9, the axis of abscissa and the axis of ordinates indicate the voltage between the anode and the cathode and the current, respectively. In this case, the thickness of the n base layer 3 was 440 μm. The other dimensions and others were substantially the same as those of the insulated gate thyristor of the first embodiment. The ON-state voltages were 1.1 V for the insulated gate thyristor of the fourth embodiment, 2.0 V for the EST-1, 2.2 V for the EST-2, 1.4 V for the EST-3, and 3.3 V for the IGBT. As in the case of the 600V devices using epitaxial wafers as described above, the results of measurements shown in FIG. 9 with respect to the 2500V devices using bulk wafers indicate that the insulated gate thyristor of the present embodiment of the invention has a significantly large RBSOA and also has a low ON-state voltage as compared with those of the ESTs and ISBT. This is because the current concentration upon application of a high voltage can be avoided by controlling the diffusion depth of the second p base region 6 to be smaller than that of the p$^+$ well region 5. Further, in the arrangement in which six first p base regions 4 and n source regions 7 in their surface layers are disposed around each of the second p base regions 6 and the n emitter region 8 in its surface layer, the first and second p base regions 4, 6 are opposed to each other over an increased length, which prevents current concentration.

Thus, the effects of the present invention, namely, increased RBSOA and reduced ON-state voltage, do not vary depending upon the resistivity of the n base layer 3 and the current amplification factor of the pnp wide base transistor. In other words, the present invention is effective to reduce the ON-state voltage and increase the RBSOA, without retard to the rated voltage of the device, and a method of producing a semiconductor crystal of the substrate of the device.

Figure 11:
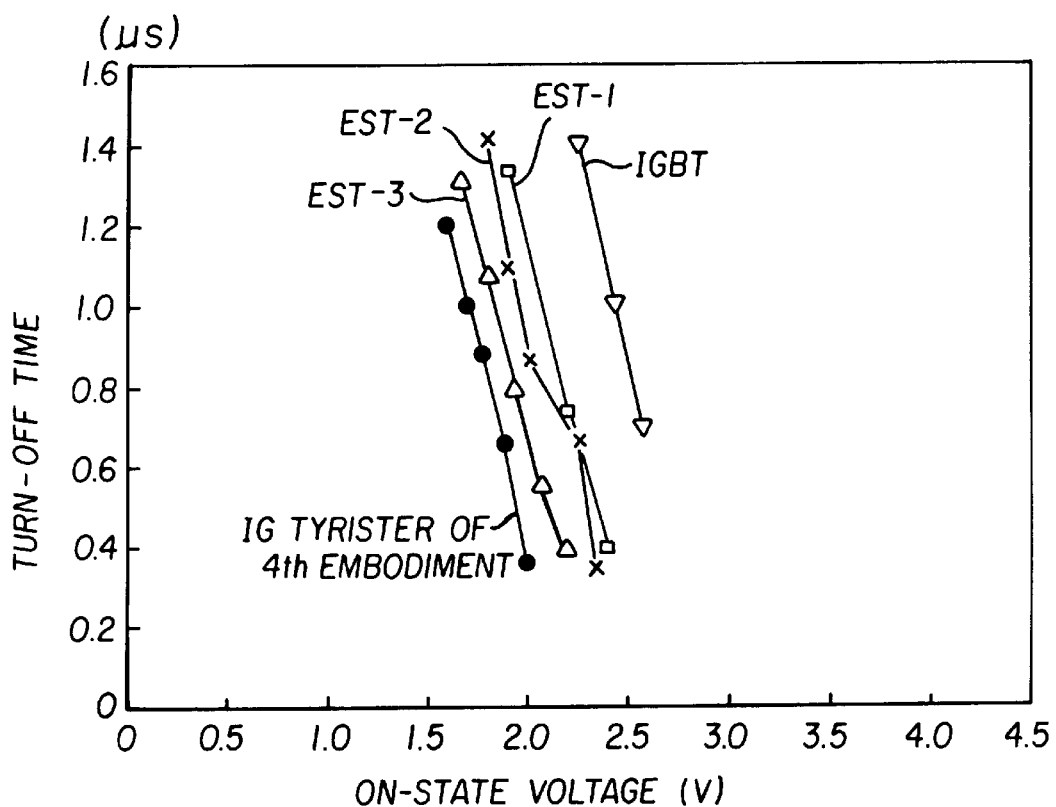
FIG. 11 is a graph showing trade-off characteristics between the ON-state voltage and turn-off time of 2500V-class devices of the fourth embodiment and comparative examples.

The graph of FIG. 11 shows a trade-off characteristic between the ON-state voltage and the turn-off time of the 2500V devices as described above. The axis of abscissa indicates the ON-state voltage, and the axis of ordinates indicates the turn-off time. The ON-state voltage is defined by a fall of the potential occurring at 125° C. upon conduction of current of 50 A·cm$^{-2}$. The turn-off time was measured at 125° C. In any case, the device of the fourth embodiment of the invention having the structure of FIG. 8 and the pattern of FIG. 2 exhibits a better trade-off characteristic than the ESTs and IGBT.

Fifth Embodiment

The cross sectional view of a part of an insulated gate thyristor according to the fifth embodiment of the present invention is identical with that of the first embodiment of FIG. 1, except that the first and second p base regions 4, 6 have different impurity concentrations in the thyristor of the fifth embodiment.

More specifically, the first p base region 4 and second p base region 6 are formed by implanting boron ions in the amounts of $2\times10^{14}$ cm$^{-2}$, and $8\times10^{13}$ cm$^{-2}$, respectively, which means that the amount of the boron ions implanted in the second p base region 6 is reduced 2.5 times as compared with that in the first p base region 4. The heat treatment following the ion implantation is conducted at 1150° C. for 90 min. for both of the regions 4, 6, and the diffusion depth of the first p base region 4 is no so different from that of the second p base region 6.

When the trade-off characteristic between the ON-state voltage and turn-off time of the insulated gate thyristor of the fifth embodiment was compared with that of the first embodiment, however, the ON-state voltage of the insulated gate thyristor of the fifth embodiment was found 0.12V lower than that of the first embodiment having the same turn-off time.

The reason for the lower ON-state voltage of the insulated gate thyristor of the fifth embodiment may be because the resistance of the channel under the gate electrode 10 was reduced by lowering the impurity concentration of the second p base region 6. The reduction in the impurity concentration had no influences on the withstand voltage, breakdown withstand capability of the resulting device. The above effect is not limited to the insulated gate thyristor in which the diffusion depth of the second p base region is smaller than that of the p$^+$ well region 5, but may be found in the device in which the second p base region 6 has a large diffusion depth. The similar effect may also be found in a high-voltage insulated gate thyristor using a bulk silicon wafer as in the fourth embodiment.

Sixth Embodiment

Figure 12:
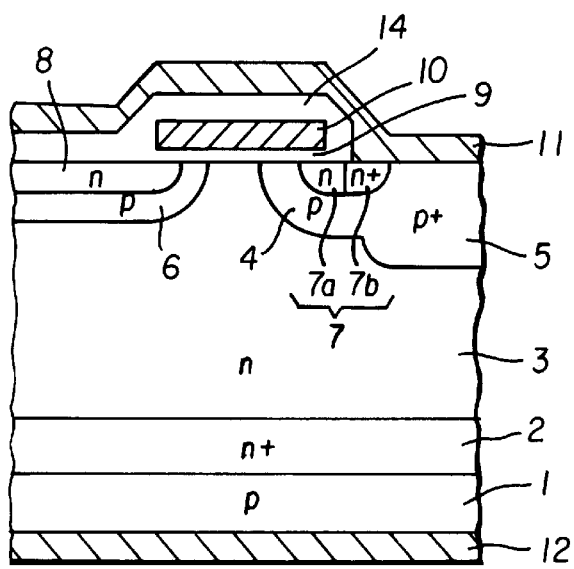
FIG. 12 is a cross sectional view of a part of an insulated gate thyristor according to the sixth embodiment of the present invention.

FIG. 12 is a cross sectional view of a part of an insulated gate thyristor according to the sixth embodiment of the present invention. This thyristor is different from that of the first embodiment of FIG. 1 only in that the n source region 6 consists of a low-concentration n source region 7a and high-concentration n source region 7b having different surface impurity concentrations.

More specifically, the n source region 7 is formed by implanting arsenic ions in the amounts of $1\times10^{15}$ cm$^{-2}$ and $5\times10^{15}$ cm$^{-2}$, to provide the low-concentration n source region 7a and high-concentration n source region 7b, respectively. The heat treatment following the ion implantation is conducted at 1000° C. for 60 min. for both of the regions 7a, 7b. The diffusion depth of the low-concentration n source region 7a is not so different from that of the high-concentration n source region 7b.

Figure 13:
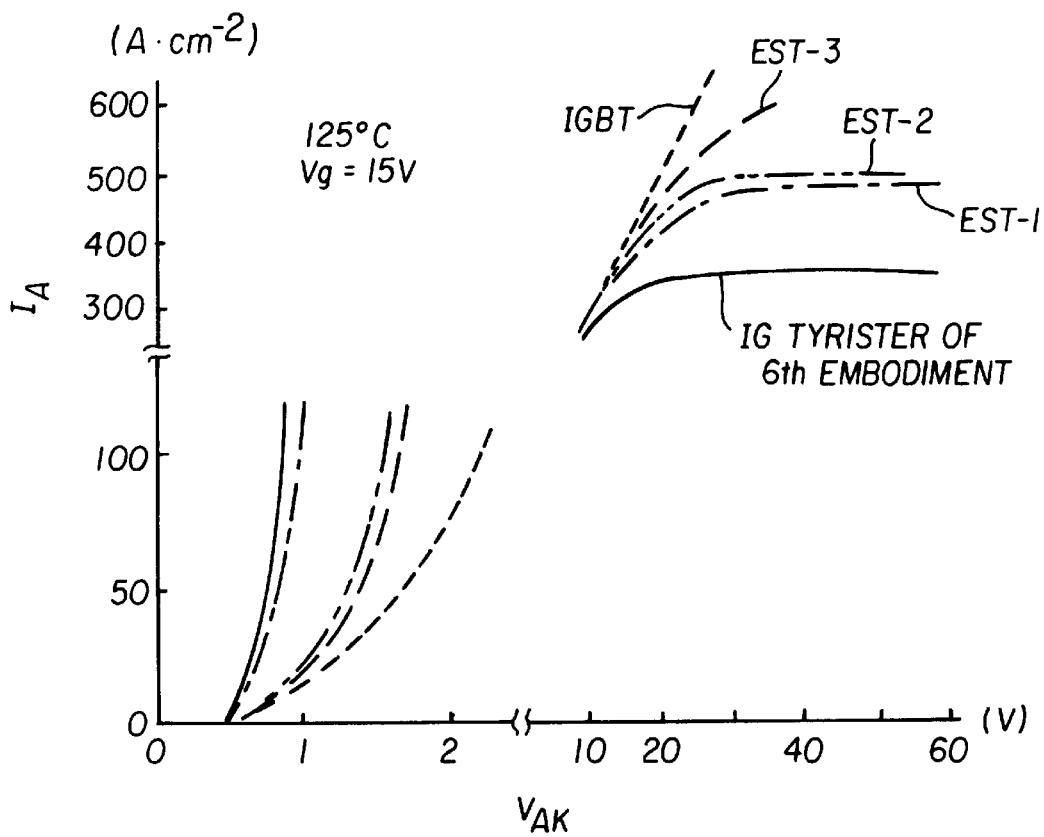
FIG. 13 is a graph showing a current-voltage characteristic of the insulated gate thyristor of the sixth embodiment.

The graph of FIG. 13 shows current-voltage characteristics of the insulated gate thyristor of the sixth embodiment, and IGBT, EST-1, EST-2 and EST-3 as comparative examples. The axis of abscissa indicates the current density, and the axis of ordinates indicates voltage. The characteristic curve of the insulated gate thyristor of the sixth embodiment shows a lower ON-state voltage in the vicinity of the rated voltage (100 A·cm$^{-2}$) than the other devices. In a region where the current has increased and is saturated, however, the insulated gate thyristor of the sixth embodiment starts being saturated most rapidly, thus providing the smallest limit current (360 A·cm$^{-2}$). The insulated gate thyristor of this embodiment is able to withstand short-circuiting of a load for 45 μs at 125° C., with the voltage between the anode and cathode being 400V and the gate voltage being 15V, whereas the insulated gate thyristor with the n source region 7 consisting solely of a high-concentration region is able to withstand short-circuiting of a load for 30 μs. Thus, the load short-circuiting withstand period of the present embodiment is 1.5 times as long as that of the thyristor with the n source region 7 having only the high-concentration region.

The reason for the small limit current of the insulated gate thyristor of the sixth embodiment may be because the low-concentration n source region 7a causes a resistance component to arise in the n source region in the large-current range. The high-concentration n source region 7b assures contact of the n source region 7 with the cathode electrode 11. The above effect is not necessarily limited to the insulated gate thyristor in which the diffusion depth of the second p base region 6 is smaller than the p$^+$ well region 6 as in the first embodiment, but may be found in a device in which the second p base region 6 has a large diffusion depth. The similar effect may also be found in a high-voltage insulated gate thyristor utilizing a bulk silicon wafer as in the fourth embodiment.

Seventh Embodiment

Figure 14:
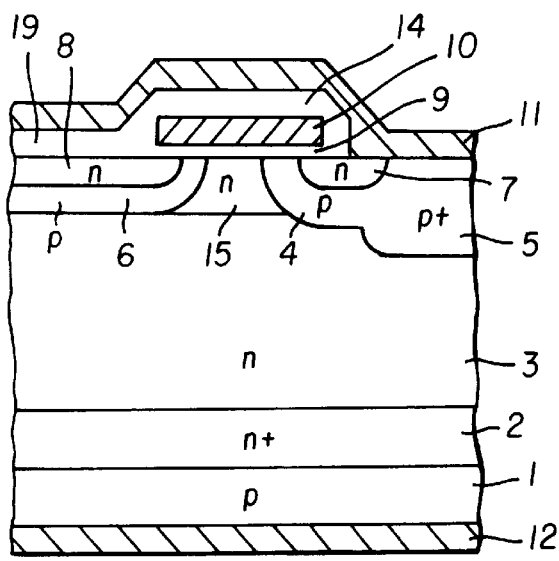
FIG. 14 is a cross sectional view showing a part of an insulated gate thyristor according to the seventh embodiment of the present invention.

FIG. 14 is a cross sectional view of a part of an insulated gate thyristor according to the seventh embodiment. This embodiment is different from that of the first embodiment of FIG. 1 in that an n auxiliary region 15 having a higher impurity concentration than the n base region 3 is provided in a surface layer of the exposed portion of the n base layer 3 between the first and second p base regions 4, 6.

After implanting boron ions (in a dose amount of $2\times10^{15}$ cm$^{-2}$) to form the p$^+$ well region 5 and effecting heat treatment at 1150° C. for 180 min., $1\times10^{12}$ cm$^{-2}$ of phosphorous ions are implanted over the entire surface of the silicon substrate so as to form the n auxiliary region 15. Thereafter, polycrystalline silicon for forming the gate electrode 10 is laminated and patterned, and boron ions are implanted to form the first p base region 4 and second p base region 6.

When a trade-off characteristic between the ON-state voltage and turn-off time of the insulated gate thyristor of the seventh embodiment was compared with that of the first embodiment, the thyristor of the seventh embodiment showed the ON-state voltage that was 0.1V lower than that of the insulated gate thyristor of the first embodiment having the same turn-off time.

The reason for the lower ON-state voltage of the insulated gate thyristor of the seventh embodiment may be because the provision of the n auxiliary region 15 having a high impurity concentration in the surface layer of the n base layer 3 right under the gate electrode 10 leads to reduction in the resistance component (so-called contact-type FET effect) arising in the n base layer 3 when a depletion layer spreads out from the pn junctions between the first and second p base regions 4, 6 and the n base layer 3. The provision of the n auxiliary region 15 had no influences on the withstand voltage, breakdown withstand capability and other characteristics of the device. The above-described effect is not limited to the insulated gate thyristor in which the diffusion depth of the second p base region is smaller than that of the p⁺ well region 5 as in the first embodiment, but may be found in the device in which the second p base region 6 has a large diffusion depth. The similar effect may also be found in a high-voltage insulated gate thyristor using a bulk silicon wafer as in the fourth embodiment.

Figure 15:
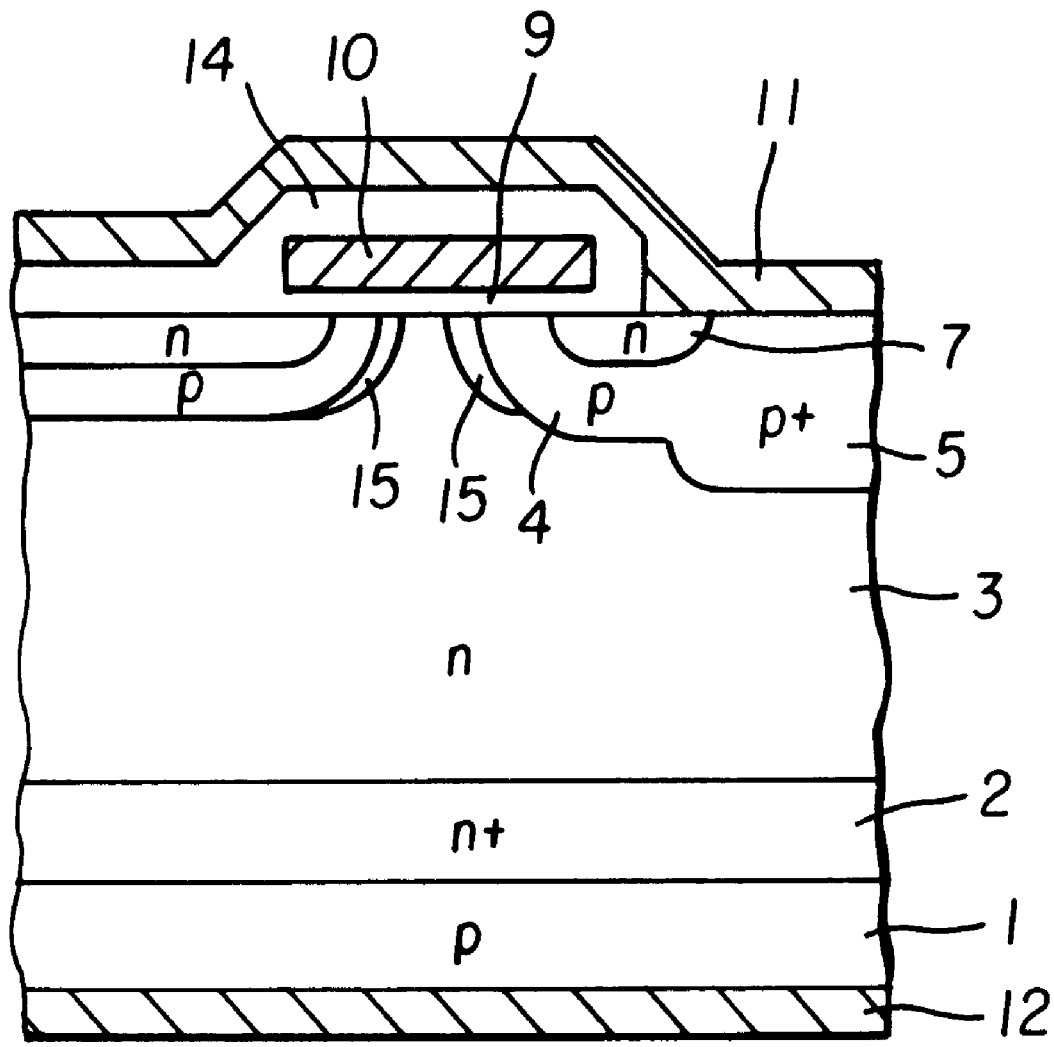
FIG. 15 is a cross sectional view showing a part of an insulated gate thyristor as a modified example of the seventh embodiment.

FIG. 15 is a modified example of the insulated gate thyristor of the seventh embodiment. As in this example, the n auxiliary region 15 is formed in selected portions of the surface of the silicon substrate, rather than over the entire surface of the substrate. Where the p⁺ well region 5 having a larger diffusion depth than the first p base region 4 is provided, in particular, phosphorous ions are implanted using a mask for forming the first p base region 4, so as to form the n auxiliary region 15.

Eighth Embodiment

Figure 16A:
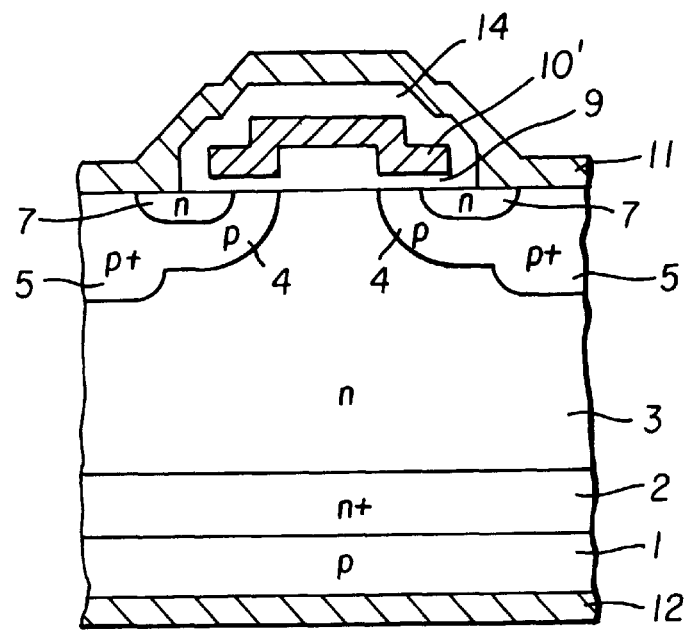
FIGS. 16 (a) and 16(b) are cross sectional views showing a part of an insulated gate thyristor according to the eighth embodiment of the present invention.
Figure 16B:
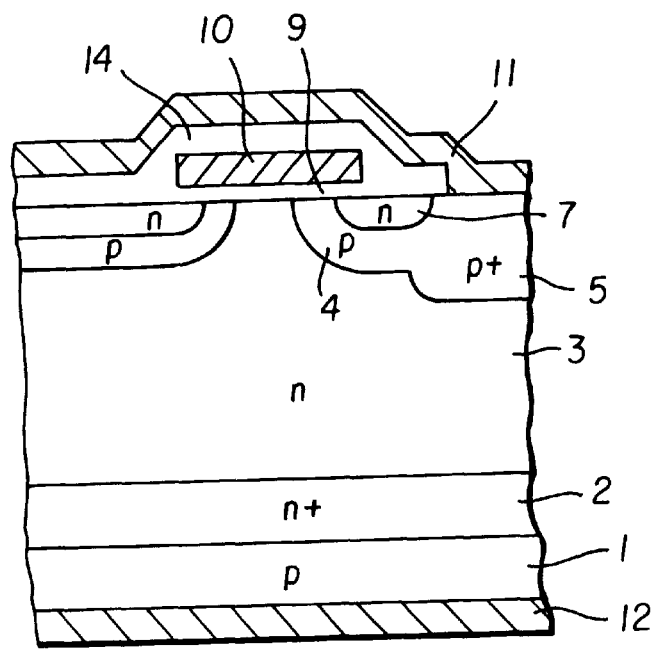

FIGS. 16(a) and 16(b) are cross sectional views of a part of an insulated gate thyristor according to the eighth embodiment of the present invention. This embodiment is different from the first embodiment of FIG. 1 in that the thickness of the gate oxide film 9 varies from portion to portion. In the cross section of FIG. 16(b) taken along a line connecting the first p base region 4 and the second p base region 6, the gate oxide film 9 has the same small thickness (of 0.05 $\mu$m) as that of the first embodiment of FIG. 1. In the cross section of FIG. 16(a) taken along a line connecting adjacent two first p base regions 4, on the other hand, the gate oxide film 9 has a small thickness in its portions located above the first p base regions 4, but has a large thickness (of 0.4 $\mu$m) in its portion located above the n base layer 3.

When the characteristics of the insulated gate thyristor of the eighth embodiment were compared with those of the first embodiment, both showed substantially the same level of ON-state voltage, but the present embodiment showed a better switching characteristic and higher breakdown withstand capability than the first embodiment. In particular, high-frequency oscillation components were reduced in the voltage-current waveform, and the resistance to noise was improved. This may be because the gate capacity was reduced due to the increase in the thickness of the gate oxide film.

In the eighth embodiment, the cathode electrode 11 is in contact with the n source region 7 as seen in the cross section taken along the line connecting the first p base region 4 and the second p base region 6, as in the first embodiment. However, the arrangement of the present embodiment may also be applied to the device in which the cathode electrode 11 does not contact with the n source region 7 in the portion of the first p base region 4 that is opposed to the second p base region 6 as in the second embodiment.

The above effect is not necessarily limited to the insulated gate thyristor in which the diffusion depth of the second p base region 6 is smaller than the p⁺ well region 5 as in the first embodiment, but may be found in a device in which the second p base region 6 has a large diffusion depth. The similar effect may also be found in a high-voltage insulated gate thyristor utilizing a bulk silicon wafer as in the fourth embodiment.

If a plurality of the illustrated embodiments are incorporated in one chip, the effects of the respective embodiments can be combined, thereby to provide an insulated gate thyristor having even more excellent characteristics.

The conventional EST is switched from the IGBT mode to the thyristor mode in which the thyristor is latched up, using a fall of the potential obtained by the current flowing in the Z direction. According to the present invention, on the other hand, the surface of the second second-conductivity-type base layer is covered with the insulating film, and a rise in the potential of the second second-conductivity-type base layer due to the hole current is utilized to switch the device to the thyristor mode, and uniformly resume the pn junction upon turn-off, whereby the controllable current is increased. Further, the diffusion depth of the second second-conductivity-type base region is controlled to be smaller than that of the first second-conductivity-type base region or the second-conductivity-type well region, so as to avoid the concentration of an electric field and increase the breakdown withstand capability of the device.

In addition, the impurity concentration of the second second-conductivity-type base region is controlled to be lower than that of the first second-conductivity-type base region, so as to lower the resistance of the inversion layer and reduce the ON-state voltage.

The first-conductivity-type source region is divided into a low-concentration region and a high-concentration region, and the cathode electrode is brought into contact with the high-concentration portion, so as to reduce the limit current and increase the device capability to withstand short-circuiting of a load.

The thickness of the gate oxide film between the first second-conductivity-type base regions is partially increased so as to reduce the gate capacity and improve the noise characteristic of the device.

Thus, the present invention provides a voltage-driven-type insulated gate thyristor having a better trade-off characteristic between the ON-state voltage and the turn-off time and a larger reverse bias safe operation region than the conventional EST and IGBT, over a wide withstand-voltage range of 600V to 2500V.

The present invention not only improves the characteristics of the device itself, but also greatly contributes to reduction of switching losses in a power switching apparatus using these devices.

What is claimed is:

1. An insulated gate thyristor comprising;
   a first-conductivity-type base layer;
   first and second second-conductivity-type base regions formed in selected areas of a surface layer of a first major surface of said first-conductivity-type base layer, said first second-conductivity-type base region including a second-conductivity-type well region;
   a first-conductivity-type source region formed in a selected area of a surface layer of said first second-conductivity-type base region;
   a first-conductivity-type emitter region formed in a selected area of a surface layer of said second second-conductivity-type base region;
   a gate electrode formed through a gate insulating film on a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;
   a first main electrode that contacts both an exposed portion of said first second-conductivity-type base layer and said first-conductivity-type source region;
   a second-conductivity-type emitter layer formed on a second surface of said first-conductivity-type base layer;
   a second main electrode that contacts said second-conductivity-type emitter layer; and an insulating film covering entire areas of surfaces of said second second-conductivity-type base region and said first-conductivity-type emitter region; wherein said second second-conductivity-type base region has a diffusion depth that is smaller than a larger one of diffusion depths of said first second-conductivity-type base region and said second-conductivity-type well region.

2. An insulated gate thyristor according to claim 1, wherein said second second-conductivity-type base region has a surface impurity concentration that is lower than that of said first second-conductivity-type base region.

3. An insulated gate thyristor according to claim 1, wherein said first-conductivity-type source region comprises a first region having a first surface impurity concentration, and a second region having a second surface impurity concentration that is lower than said first surface impurity concentration, said first main electrode being in contact with a surface of said first region having a higher surface impurity concentration than said second region.

4. An insulated gate thyristor according to claim 1, further comprising a first-conductivity-type auxiliary region formed in the exposed portion of said first-conductivity-type base layer between said first and second second-conductivity-type base regions, said first-conductivity-type auxiliary region having an impurity concentration that is higher than that of said first-conductivity-type base layer, and a diffusion depth that is smaller than those of the first and second second-conductivity-type base regions.

5. An insulated gate thyristor according to claim 1, wherein a first part of said gate insulating film formed on the exposed portion of said first-conductivity-type base layer which is interposed between two of said first second-conductivity-type base region has a thickness that is greater than a second part of the gate insulating film formed on the exposed portion of the first-conductivity-type base layer which is interposed between said first and second second-conductivity-type base regions.

6. An insulated gate thyristor according to claim 1, wherein at least one of said first and second second-conductivity-type base regions, said first-conductivity-type emitter region and said first-conductivity-type source region has one of polygonal, circular and elliptical shapes.

7. An insulated gate thyristor according to claim 1, wherein said first second-conductivity-type base region and said first-conductivity-type source region formed in the surface layer thereof are formed so as to surround said second second-conductivity-type base region.

8. An insulated gate thyristor according to claim 1, wherein a plurality of said first second-conductivity-type base regions are formed around said second second-conductivity-type base region.

9. An insulated gate thyristor according to claim 8, wherein a plurality of said first second-conductivity-type base regions and said first-conductivity-type source regions formed in surface layers thereof are formed around said second second-conductivity-type base region, and wherein said gate electrode having a substantially annular shape is provided so as to surround said insulating film on the second second-conductivity-type base region, said first main electrode being provided through an insulating film on one side of the gate electrode remote from the second second-conductivity-type base region.

10. An insulated gate thyristor according to claim 9, wherein a contact portion between said first main electrode and said first second-conductivity-type base region and said first-conductivity-type source region has a shape selected from a polygonal shape, a circular shape and an elliptical shape.

11. An insulated gate thyristor according to claim 9, wherein a first surface portion of said first-conductivity-type source region which is opposed to said second second-conductivity-type base region is covered with an insulating film, and a second surface portion of said first-conductivity-type source region which is opposed to said first second-conductivity-type base region is in contact with said first main electrode.

12. An insulated gate thyristor according to claim 9, wherein said first-conductivity-type emitter region has a diffusion depth that is greater than that of said first-conductivity-type source region.

13. An insulated gate thyristor according to claim 9, wherein lifetime killers are present in local portions of the thyristor.

14. An insulated gate thyristor according to claim 9, further comprising a first-conductivity-type buffer layer between said first-conductivity-type base layer and said second-conductivity-type emitter layer, said first-conductivity-type buffer layer having a higher impurity concentration than the first-conductivity-type base layer.

15. An insulated gate thyristor comprising;

a first-conductivity-type base layer;

first and second second-conductivity-type base regions formed in selected areas of a surface layer of a first major surface of said first-conductivity-type base layer;

a first-conductivity-type source region formed in a selected area of a surface layer of said first second-conductivity-type base region;

a first-conductivity-type emitter region formed in a selected area of a surface layer of said second second-conductivity-type base region;

a gate electrode formed through a gate insulating film on a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;

a first main electrode that contacts both an exposed portion of said first second-conductivity-type base layer and said first-conductivity-type source region;

a second-conductivity-type emitter layer formed on a second surface of said first-conductivity-type base layer;

a second main electrode that contacts said second-conductivity-type emitter layer; and an insulating film covering entire areas of surfaces of said second second-conductivity-type base region and said first-conductivity-type emitter region; and wherein said second second-conductivity-type base region has a surface impurity concentration that is lower than that of said first second-conductivity-type base region.

16. An insulated gate thyristor according to claim 15, wherein said first second-conductivity-type base region includes a second-conductivity-type well region, and wherein said second second-conductivity-type base region has a diffusion depth that is smaller than a larger one of diffusion depths of said first second-conductivity-type base region and said second-conductivity-type well region.

17. An insulated gate thyristor according to claim 15, wherein said first-conductivity-type source region comprises a first region having a first surface impurity concentration, and a second region having a second surface impurity concentration that is lower than said first surface impurity concentration, said first main electrode being in contact with a surface of said first region having a higher surface impurity concentration than said second region.

18. An insulated gate thyristor according to claim 15, further comprising a first-conductivity-type auxiliary region formed in the exposed portion of said first-conductivity-type base layer between said first and second second-conductivity-type base regions, said first-conductivity-type auxiliary region having an impurity concentration that is higher than that of said first-conductivity-type base layer, and a diffusion depth that is smaller than those of the first and second second-conductivity-type base regions.

19. An insulated gate thyristor according to claim 15, wherein a first part of said gate insulating film formed on the exposed portion of said first-conductivity-type base layer which is interposed between two of said first second-conductivity-type base region has a thickness that is greater than a second part of the gate insulating film formed on the exposed portion of the first-conductivity-type base layer which is interposed between said first and second second-conductivity-type base regions.

20. An insulated gate thyristor according to claim 15, wherein at least one of said first and second second-conductivity-type base regions, said first-conductivity-type emitter region and said first-conductivity-type source region has one of polygonal, circular and elliptical shapes.

21. An insulated gate thyristor according to claim 15, wherein said first second-conductivity-type base region and said first-conductivity-type source region formed in the surface layer thereof are formed so as to surround said second second-conductivity-type base region.

22. An insulated gate thyristor according to claim 15, wherein a plurality of said first second-conductivity-type base regions are formed around said second second-conductivity-type base region.

23. An insulated gate thyristor comprising;
a first-conductivity-type base layer;
first and second second-conductivity-type base regions formed in selected areas of a surface layer of a first major surface of said first-conductivity-type base layer;
a first-conductivity-type source region formed in a selected area of a surface layer of said first second-conductivity-type base region;
a first-conductivity-type emitter region formed in a selected area of a surface layer of said second second-conductivity-type base region;
a gate electrode formed through a gate insulating film on a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;
a first main electrode that contacts both an exposed portion of said first second-conductivity-type base layer and said first-conductivity-type source region;
a second-conductivity-type emitter layer formed on a second surface of said first-conductivity-type base layer;
a second main electrode that contacts said second-conductivity-type emitter layer; and
an insulating film covering entire areas of surfaces of said second second-conductivity-type base region and said first-conductivity-type emitter region; wherein said first-conductivity-type source region comprises a first region having a first surface impurity concentration, and a second region having a second surface impurity concentration that is lower than said first surface impurity concentration, said first main electrode being in contact with a surface of said first region having a higher surface impurity concentration than said second region.

24. An insulated gate thyristor according to claim 23, wherein said first second-conductivity-type base region includes a second-conductivity-type well region, and wherein said second second-conductivity-type base region has a diffusion depth that is smaller than a larger one of diffusion depths of said first second-conductivity-type base region and said second-conductivity-type well region.

25. An insulated gate thyristor according to claim 23, wherein said second second-conductivity-type base region has a surface impurity concentration that is lower than that of said first second-conductivity-type base region.

26. An insulated gate thyristor according to claim 23, further comprising a first-conductivity-type auxiliary region formed in the exposed portion of said first-conductivity-type base layer between said first and second second-conductivity-type base regions, said first-conductivity-type auxiliary region having an impurity concentration that is higher than that of said first-conductivity-type base layer, and a diffusion depth that is smaller than those of the first and second second-conductivity-type base regions.

27. An insulated gate thyristor according to claim 23, wherein a first part of said gate insulating film formed on the exposed portion of said first-conductivity-type base layer which is interposed between two of said first second-conductivity-type base region has a thickness that is greater than a second part of the gate insulating film formed on the exposed portion of the first-conductivity-type base layer which is interposed between said first and second second-conductivity-type base regions.

28. An insulated gate thyristor according to claim 23, wherein at least one of said first and second second-conductivity-type base regions, said first-conductivity-type emitter region and said first-conductivity-type source region has one of polygonal, circular and elliptical shapes.

29. An insulated gate thyristor according to claim 23, wherein said first second-conductivity-type base region and said first-conductivity-type source region formed in the surface layer thereof are formed so as to surround said second second-conductivity-type base region.

30. An insulated gate thyristor according to claim 23, wherein a plurality of said first second-conductivity-type base regions are formed around said second second-conductivity-type base region.

31. An insulated gate thyristor comprising;
a first-conductivity-type base layer;
first and second second-conductivity-type base regions formed in selected areas of a surface layer of a first major surface of said first-conductivity-type base layer;
a first-conductivity-type source region formed in a selected area of a surface layer of said first second-conductivity-type base region;
a first-conductivity-type emitter region formed in a selected area of a surface layer of said second second-conductivity-type base region;
a gate electrode formed through a gate insulating film on a surface of said first second-conductivity-type base region, an exposed portion of said first-conductivity-type base layer, and a surface of said second secondconductivity-type base region, which surfaces and exposed portion are interposed between said first-conductivity-type source region and said first-conductivity-type emitter region;

a first main electrode that contacts both an exposed portion of said first second-conductivity-type base layer and said first-conductivity-type source region;

a second-conductivity-type emitter layer formed on a second surface of said first-conductivity-type base layer;

a second main electrode that contacts said second-conductivity-type emitter layer;

an insulating film covers entire areas of surfaces of said second second-conductivity-type base region and said first-conductivity-type emitter region; and a first-conductivity-type auxiliary region formed in the exposed portion of said first-conductivity-type base layer between said first and second second-conductivity-type base regions, said first-conductivity-type auxiliary region having an impurity concentration that is higher than that of said first-conductivity-type base layer, and a diffusion depth that is smaller than those of the first and second second-conductivity-type base regions.

32. An insulated gate thyristor according to claim 31, wherein said first second-conductivity-type base region includes a second-conductivity-type well region, and wherein said second second-conductivity-type base region has a diffusion depth that is smaller than a larger one of diffusion depths of said first second-conductivity-type base region and said second-conductivity-type well region.

33. An insulated gate thyristor according to claim 31, wherein said second second-conductivity-type base region has a surface impurity concentration that is lower than that of said first second-conductivity-type base region.

34. An insulated gate thyristor according to claim 31, wherein said first-conductivity-type source region comprises a first region having a first surface impurity concentration, and a second region having a second surface impurity concentration that is lower than said first surface impurity concentration, said first main electrode being in contact with a surface of said first region having a higher surface impurity concentration than said second region.

35. An insulated gate thyristor according to claim 31, wherein a first part of said gate insulating film formed on the exposed portion of said first-conductivity-type base layer which is interposed between two of said first second-conductivity-type base region has a thickness that is greater than a second part of the gate insulating film formed on the exposed portion of the first-conductivity-type base layer which is interposed between said first and second second-conductivity-type base regions.

36. An insulated gate thyristor according to claim 31, wherein at least one of said first and second second-conductivity-type base regions, said first-conductivity-type emitter region and said first-conductivity-type source region has one of polygonal, circular and elliptical shapes.

37. An insulated gate thyristor according to claim 31, wherein said first second-conductivity-type base region and said first-conductivity-type source region formed in the surface layer thereof are formed so as to surround said second second-conductivity-type base region.

38. An insulated gate thyristor according to claim 31, wherein a plurality of said first second-conductivity-type base regions are formed around said second second-conductivity-type base region.

39. An insulated gate thyristor comprising;

a first-conductivity-type base layer;

first and second second-conductivity-type base regions formed in selected areas of a surface layer of a first major surface of said first-conductivity-type base layer;

a first-conductivity-type source region formed in a selected area of a surface layer of said first second-conductivity-type base region;

a first-conductivity-type emitter region formed in a selected area of a surface layer of said second second-conductivity-type base region;

a gate electrode formed through a gate insulating film on a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;

a first main electrode that contacts both an exposed portion of said first second-conductivity-type base layer and said first-conductivity-type source region;

a second-conductivity-type emitter layer formed on a second surface of said first-conductivity-type base layer;

a second main electrode that contacts said second-conductivity-type emitter layer; and an insulating film covering entire areas of surfaces of said second second-conductivity-type base region and said first-conductivity-type emitter region; wherein a first part of said gate insulating film on the exposed portion of said first-conductivity-type base layer which is interposed between two of said first second-conductivity-type base region has a thickness that is greater than a second part of the gate insulating film on the exposed portion of the first-conductivity-type base layer which is interposed between said first and second second-conductivity-type base regions.

40. An insulated gate thyristor according to claim 39, wherein said first second-conductivity-type base region includes a second-conductivity-type well region, and wherein said second second-conductivity-type base region has a diffusion depth that is smaller than a larger one of diffusion depths of said first second-conductivity-type base region and said second-conductivity-type well region.

41. An insulated gate thyristor according to claim 39, wherein said second second-conductivity-type base region has a surface impurity concentration that is lower than that of said first second-conductivity-type base region.

42. An insulated gate thyristor according to claim 39, wherein said first-conductivity-type source region comprises a first region having a first surface impurity concentration, and a second region having a second surface impurity concentration that is lower than said first surface impurity concentration, said first main electrode being in contact with a surface of said first region having a higher surface impurity concentration than said second region.

43. An insulated gate thyristor according to claim 39, further comprising a first-conductivity-type auxiliary region formed in the exposed portion of said first-conductivity-type base layer between said first and second secondconductivity-type base regions, said first-conductivity-type auxiliary region having an impurity concentration that is higher than that of said second region.

44. An insulated gate thyristor according to claim 39, wherein at least one of said first and second second-conductivity-type base regions, said first-conductivity-type emitter region and said first-conductivity-type source region has one of polygonal, circular and elliptical shapes.

45. An insulated gate thyristor according to claim 39, wherein said first second-conductivity-type base region and said first-conductivity-type source region formed in the surface layer thereof are formed so as to surround said second second-conductivity-type base region.

46. An insulated gate thyristor according to claim 39, wherein a plurality of said first second-conductivity-type base regions are formed around said second second-conductivity-type base region.

* * * * *